(12) United States Patent
Solomko et al.

(10) Patent No.: US 10,170,822 B2
(45) Date of Patent: Jan. 1, 2019

(54) COMMUNICATION DEVICE AND METHOD FOR DETERMINING A LOAD IMPEDANCE

(71) Applicant: Infineon Technologies AG, Neubiberg (DE)

(72) Inventors: Valentyn Solomko, Munich (DE); Anthony Thomas, Munich (DE); Winfried Bakalski, Munich (DE); Ruediger Bauder, Feldkirchen-Westerham (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 15/610,697

(22) Filed: Jun. 1, 2017

(65) Prior Publication Data
US 2017/0352947 A1    Dec. 7, 2017

(30) Foreign Application Priority Data
Jun. 6, 2016 (DE) .................. 10 2016 110 363

(51) Int. Cl.
| H01Q 1/24 | (2006.01) |
| G01R 27/26 | (2006.01) |
| H04B 1/04 | (2006.01) |

(52) U.S. Cl.
CPC ......... H01Q 1/248 (2013.01); G01R 27/2694 (2013.01); H01Q 1/241 (2013.01); H04B 1/04 (2013.01)

(58) Field of Classification Search
CPC ........... H01Q 1/248; H01Q 1/241; H04B 1/04
See application file for complete search history.

(56) References Cited

U.S. PATENT DOCUMENTS

| 2009/0045887 A1* | 2/2009 | Tervo ...................... H01P 5/183 333/111 |
| 2011/0057746 A1 | 3/2011 | Yamamoto et al. |
| 2011/0254637 A1* | 10/2011 | Manssen ................. H03H 7/40 333/2 |

(Continued)

FOREIGN PATENT DOCUMENTS

| DE | 102010040290 A1 | 3/2011 |
| DE | 102015115566 A1 | 3/2016 |

(Continued)

*Primary Examiner* — Giovanni Astacio-Oquendo
*Assistant Examiner* — Alvaro Fortich
(74) *Attorney, Agent, or Firm* — Viering Jentschura & Partner MBB

(57) ABSTRACT

According to one embodiment, a communication device is described comprising an antenna, a signal path for supplying a signal to the antenna, two directional couplers arranged within the signal path, wherein each directional coupler is coupled to an adjustable impedance defining the characteristic impedance of the directional coupler, a controller configured to set, for each of a plurality of impedances, the adjustable impedances of the directional couplers to the impedance, a return loss measurement circuit configured to determine, for each of the plurality of impedances, a return loss of the signal path when the adjustable impedances of the directional couplers are set to the impedance and a load impedance determination circuit configured to determine a load impedance of the signal path based on the determined return losses.

31 Claims, 20 Drawing Sheets

(56) References Cited

U.S. PATENT DOCUMENTS

| | | |
|---|---|---|
| 2015/0072671 A1 | 3/2015 | Rofougaran et al. |
| 2016/0028363 A1* | 1/2016 | Li .......................... H01P 5/187 |
| | | 333/116 |
| 2016/0065167 A1 | 3/2016 | Granger-Jones et al. |
| 2016/0079650 A1 | 3/2016 | Solomko et al. |
| 2016/0126619 A1 | 5/2016 | Tenbroek et al. |

FOREIGN PATENT DOCUMENTS

| | | |
|---|---|---|
| EP | 1289139 B1 | 10/2009 |
| KR | 1020130070445 A | 6/2013 |
| KR | 1020150108255 A | 9/2015 |
| WO | 2009144648 A2 | 12/2009 |

\* cited by examiner

COMMUNICATION DEVICE AND METHOD FOR DETERMINING A LOAD IMPEDANCE

CROSS-REFERENCE TO RELATED APPLICATION

This application claims priority to German Patent Application Serial No. 10 2016 110 363.2, which was filed Jun. 6, 2016, and is incorporated herein by reference in its entirety.

TECHNICAL FIELD

The present disclosure relates to communication devices and methods for determining a load impedance.

BACKGROUND

Modern mobile communication devices generate and receive RF (radio frequency) signals using integrated antennas. Operation of these devices is dependent upon characteristics of the antenna, signals, frequencies, and environmental conditions. These characteristics can impact talk time, power consumption, dropped calls and the like.

One characteristic is the impedance or impedance matching of the integrated antennas and RF signal generation circuitry. The impedance of the antenna can vary according to factors such as frequency, temperature, environmental conditions and the like as well as user's interaction with a device. If there is an impedance mismatch, excess power consumption and weak signals can be generated. From a user's perspective, impedance mismatch can lead to a reduction in talk time, short battery life and dropped calls.

Accordingly, in order to enhance power transfer to transmitted signals, efficient approaches for impedance matching between a RF generation circuitry and an antenna are desirable.

SUMMARY

According to one embodiment, a communication device is provided comprising an antenna, a signal path for supplying a signal to the antenna, two directional couplers arranged within the signal path, wherein each directional coupler is coupled to an adjustable impedance defining the characteristic impedance of the directional coupler, a controller configured to set, for each of a plurality of impedances, the adjustable impedances of the directional couplers to the impedance, a return loss measurement circuit configured to determine, for each of the plurality of impedances, a return loss of the signal path when the adjustable impedances of the directional couplers are set to the impedance and a load impedance determination circuit configured to determine a load impedance of the signal path based on the determined return losses According to a further embodiment, a method for determining a load impedance is provided comprising setting, for each of a plurality of impedances, adjustable impedances of two directional couplers arranged within a signal path for supplying a signal to an antenna of a communication device to the impedance, wherein the adjustable impedance of a directional coupler defines the characteristic impedance of the directional coupler, determining, for each of the plurality of impedances, a return loss of the signal path when the adjustable impedances of the directional couplers are set to the impedance and determining a load impedance of the signal path based on the determined return losses.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various aspects are described with reference to the following drawings, in which.

DESCRIPTION

The following detailed description refers to the accompanying drawings that show, by way of illustration, specific details and aspects of this disclosure in which the invention may be practiced. Other aspects may be utilized and structural, logical, and electrical changes may be made without departing from the scope of the invention. The various aspects of this disclosure are not necessarily mutually exclusive, as some aspects of this disclosure can be combined with one or more other aspects of this disclosure to form new aspects.

Impedance matching is used to match an impedance of an antenna or load with signal generation circuitry. Power transfer, signal generation and the like are improved when there is impedance matching.

One technique to provide impedance matching is to incorporate an antenna tuning system. The antenna tuning system measures the amplitude and/or phase of RF signals transmitted to the antenna and reflected back from the antenna. The measurements are provided to an RF front end controller, which adjusts a tuning impedance for the antenna to enhance impedance matching.

One parameter based on the measurements is a standing wave ratio, which is used by the RF front end controller to alter the tuning impedance. In one example, a directional coupler is attached to the RF line and power detectors are attached to coupled and isolated ports of a directional coupler. The detected power is digitized and processed in a digital domain to extract information associated with the standing wave ratio. This approach requires multiple analog to digital converters that are isolated and well matched in order to post-process the signal correctly. Additionally, this approach requires complex mathematical operations, such as division, logarithmic operations, temperature compensation for diode curves and the like. Furthermore, this approach, including multiple analog to digital converters and complex digital processing, requires substantial silicon area and current or power.

According to various embodiments, analog power detectors and a comparator are used to detect a return loss and a voltage standing wave ratio (VSWR) in an RF line or system. The VSWR is a measure of impedance matching of loads (e.g., at an antenna) to the impedance of RF generation circuitry. The VSWR is the ratio of the standing wave's amplitude at a maximum to the amplitude at a minimum. The VSWR can be used by an RF front end controller to adjust an antenna tuner and facilitate impedance matching between the RF circuit and the antenna.

Figure 1:
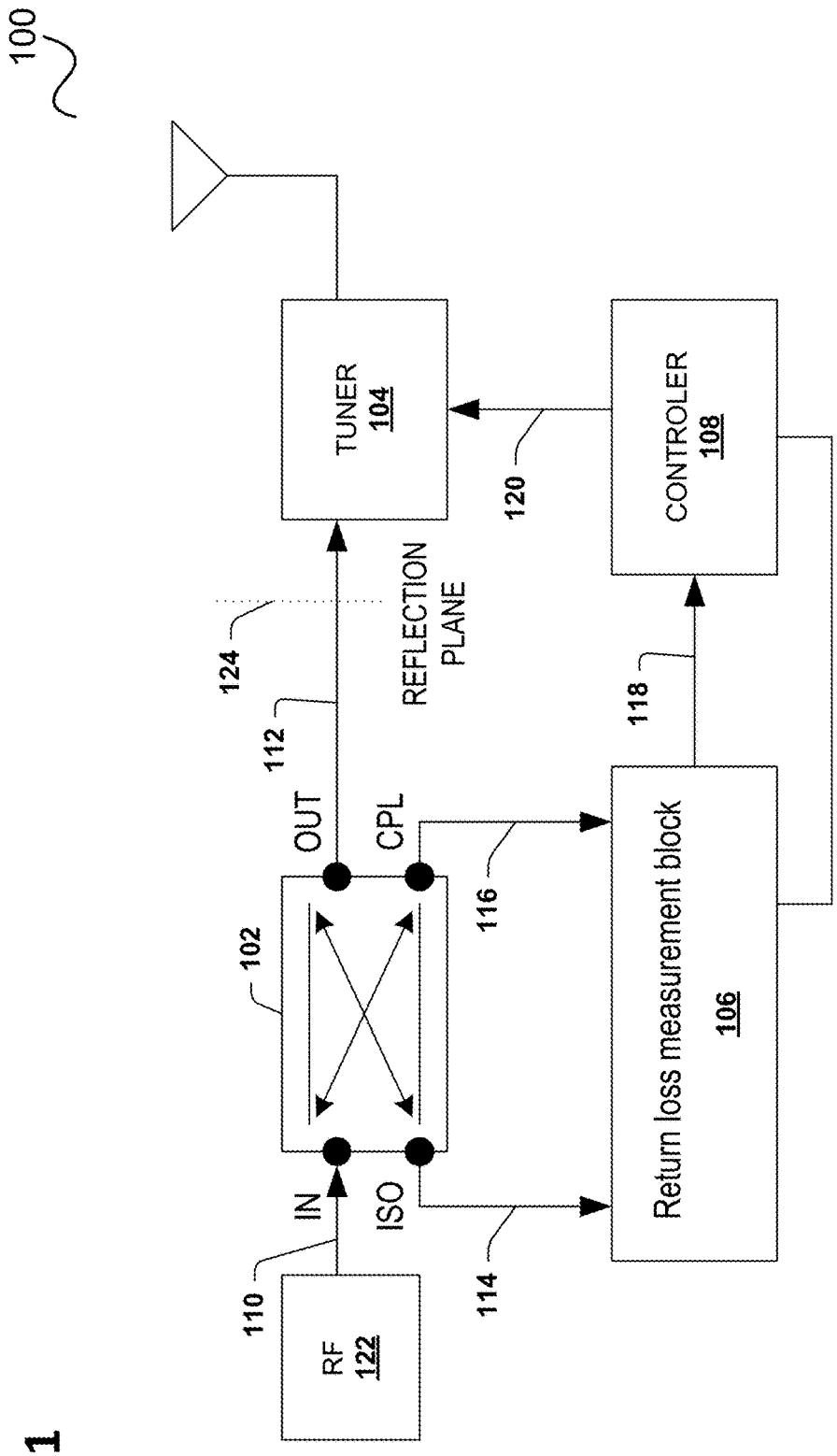
FIG. 1 is a block diagram illustrating an antenna tuning arrangement using analog standing wave ratio detection.

FIG. 1 is a block diagram illustrating an antenna tuning arrangement 100 using analog standing wave ratio detection. The standing wave ratio is used to enhance or improve impedance matching.

The antenna tuning arrangement 100 may for example be located in a radio communication device such as a mobile phone.

The arrangement 100 includes a directional coupler 102, an antenna tuner 104, a return loss measurement block 106, and an RF front end controller 108. The arrangement 100 determines a standing wave ratio for a generated RF signal 110 that is used to enhance or improve impedance matching. The standing wave ratio is based on RF generation circuitry 122 and its antenna and reflection plane 124.

The directional coupler 102 has four ports, an input port IN, an output port OUT, an isolated port ISO and a coupled port CPL. The line between the IN port and the OUT port is the main line and the line between the CPL port and the ISO port is the coupled line.

The coupler 102 has a selected coupling factor based on the output power at the CPL port Pcpl versus the input power at the IN port Pin. The coupler 102 has an isolation based on the power at the ISO port Piso and the power and the IN port Pin. The coupler 102 has an insertion loss defined as the power loss at the IN port Pin to the OUT port Pout.

The directional coupler 102 receives an RF input signal 110 at the IN port and generates an RF output signal 112 at the OUT port, an isolated signal 114 at the ISO port and a coupled signal 116 at the CPL port. RF generation circuitry 122 generates the RF input signal 110. The RF generation circuitry 122 has an impedance that may vary during operation.

The coupled signal 116 is also referred to as a forward signal and the isolated signal 114 is also referred to as a reverse signal.

The directional coupler 102 provides the RF output signal 112 as substantially unaltered from the input signal 110. The RF output signal 112 is provided to the antenna tuner 104 for transmission via an antenna or multiple antennas.

The directional coupler 102 generates the coupled signal 116 at the CPL port attenuated or reduced by a coupling factor. The isolated signal 114 is generated at the ISO port with the selected isolation.

The return loss measurement block 106 receives the isolated signal 114 and the coupled signal 116. The return loss measurement block 106 may omit analog to digital conversion and use analog components to generate a return loss (RL) 118. The return loss measurement block 106 is configured to attenuate at least the coupled signal 116 and obtain power measurements based on the coupled signal 116 and the isolated signal 114. The return loss measurement block 106 performs a comparison of the power measurements to generate the return loss RL 118. The return loss RL 118 is based on the reflection plane 124. The return loss RL 118 measures an effectiveness of power delivery from RF circuitry 122 to a load or antenna in terms of power out (Pout) from the OUT port and power reflected back via the reflection plane 124.

The return loss 118 is provided to the controller 108. The controller 108 is configured to analyze the return loss 118 and generate an antenna tuner control 120 based on the signal 118. The detector and/or the controller 108 may calculate the VSWR from the return loss 118 and generate the antenna tuner control 120 based on the VSWR instead of the return loss RL. The controller 108 can be implemented in circuitry and use one or more processors and/or memory to perform the analysis and generate the control signal 120. The control signal 120 is generated to enhance impedance matching. The controller 108 can also be involved in operation of the return loss measurement block 106.

The antenna tuner 104 is configured to improve power transfer between RF generation circuitry 122 and the antenna. The antenna tuner 104 improves the power transfer by enhancing or improving matching of the impedance of the RF generation circuitry 122 and the antenna. The antenna tuner 104 adjusts an impedance seen by the antenna based on the control signal 120 from the RF front end controller 108.

Figure 2:
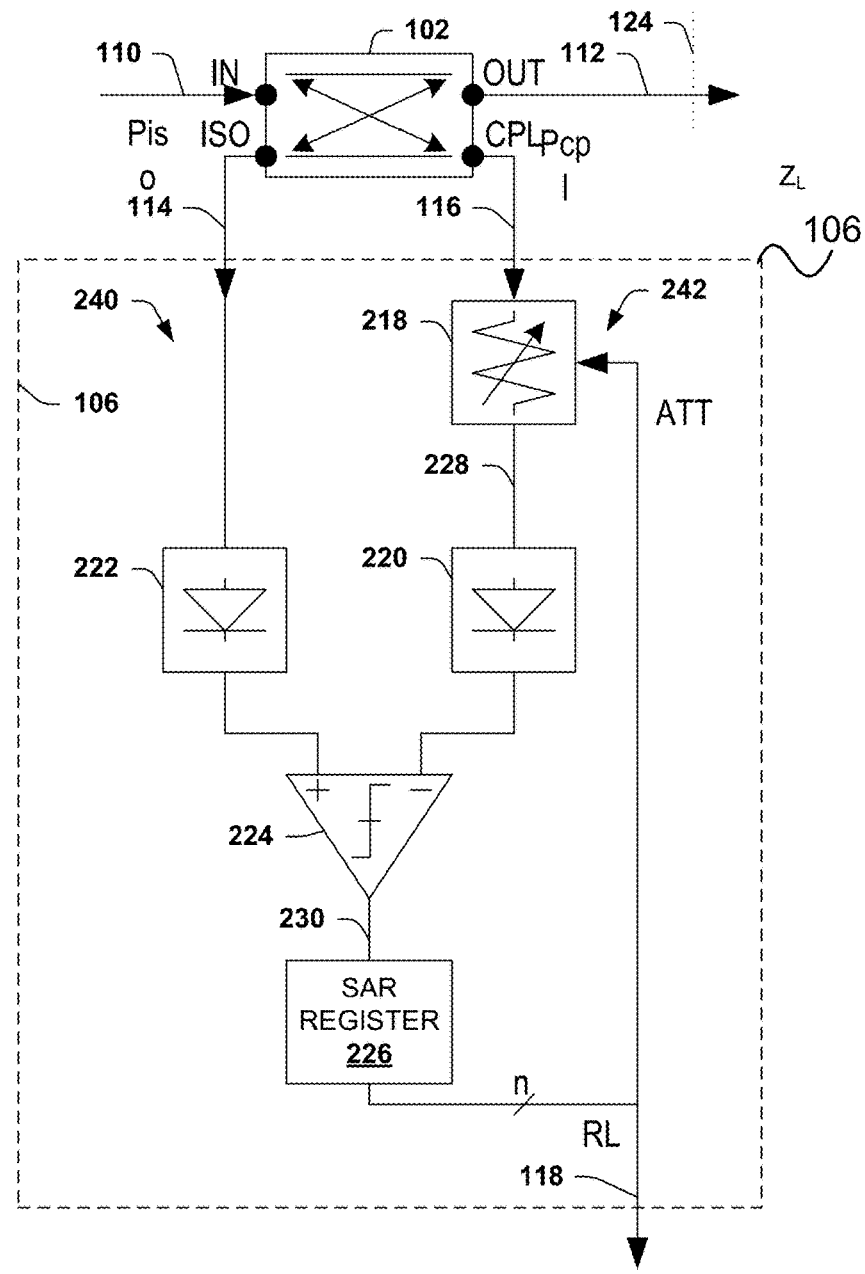
FIG. 2 shows an analog standing wave ratio detector.

FIG. 2 shows an analog standing wave ratio detector 106. The detector 106 compares analog power measurements based on a coupled signal and an isolated signal to generate a return loss, which represents a standing wave ratio.

The detector 106 generates a return loss or standing wave ratio 118 based on an isolated signal 114 and a coupled signal 116. The detector 106 includes an attenuation component 218, a coupled power detector 220, an isolated power detector 222, a comparator 224 and a successive approximation (SAR) register 226.

The detector 106 is coupled to a directional coupler 102 as described above with regard to FIG. 1.

The attenuation component 218 includes adjustable circuitry configured to reduce the power of the coupled signal 116 to more closely match a power of the isolated signal 114. The circuitry can include, for example, an adjustable resistor that controllably reduces power. The amount of attenuation ATT is set by the SAR register 226. In one example, ATT is specified in decibels. The amount of attenuation ATT is typically provided in digital to the attenuation component 218. The attenuation component 218 generates an attenuated version 228 of the coupled signal 116 based on the amount of attenuation ATT.

The coupled power detector 220 measures/detects power of the attenuated signal 228, which has been derived from the coupled signal 116. The isolated power detector 222 measures/detects power of the isolated signal 118. The power detectors 220 and 222 are analog and provide their measurements in analog form as well. The coupled power detector 220 generates a coupled power as a voltage while the isolated power detector 222 generates an isolated power as a voltage measurement.

The comparator 224 compares the coupled power Pcpl with the isolated power Piso and generates a comparator output 230. This output or value is stored within the SAR register 226.

The SAR register 226 sequentially generates the return loss signal RL in n steps as a multi bit value having n bits. The process is referred to as successive approximation. Each step or the i-th step sets the i-th bit to a high state and reads out the comparator 224. If the comparator output 230 indicates that Pcpl is larger than the Piso, the SAR register 226 leaves the i-th bit of the return loss signal RL "high", which is also the ATT signal. If the comparator output 230 indicates that Pcpl is lower than the Piso, the SAR register 226 changes the i-th bit of the return loss signal RL to "low". The conversion process starts from the most significant bit of the return loss signal RL (i=n−1) and ends at the least significant bit (i=0). At the end of the conversion process, the multi-bit return loss signal RL indicates the return loss from the reference plane 124. The reference plane 124 is downstream of the OUT port of the directional coupler 102.

The return loss RL 118 and the attenuation amount ATT signal are shown connected on the same line. However, the return loss 118 can be provided on a separate line or output from the attenuation amount ATT signal.

A controller, such as the controller 108, is configured to perform the conversion process of the detector 106 using the SAR register 226 and indicate when the conversion process is complete and the n digit RL signal is complete. The controller can be part of the detector 106 or be external to the detector 106.

A controller, such as the controller 108, may be configured to perform the conversion process of the detector 106 using another sequential state machine and indicate when the conversion process is complete and the n digit RL signal is complete. Once deemed accurate or complete by performing n iterations, the signal RL may be used by an RF front end controller to control an antenna tuner as described with reference to FIG. 1.

Figure 3:
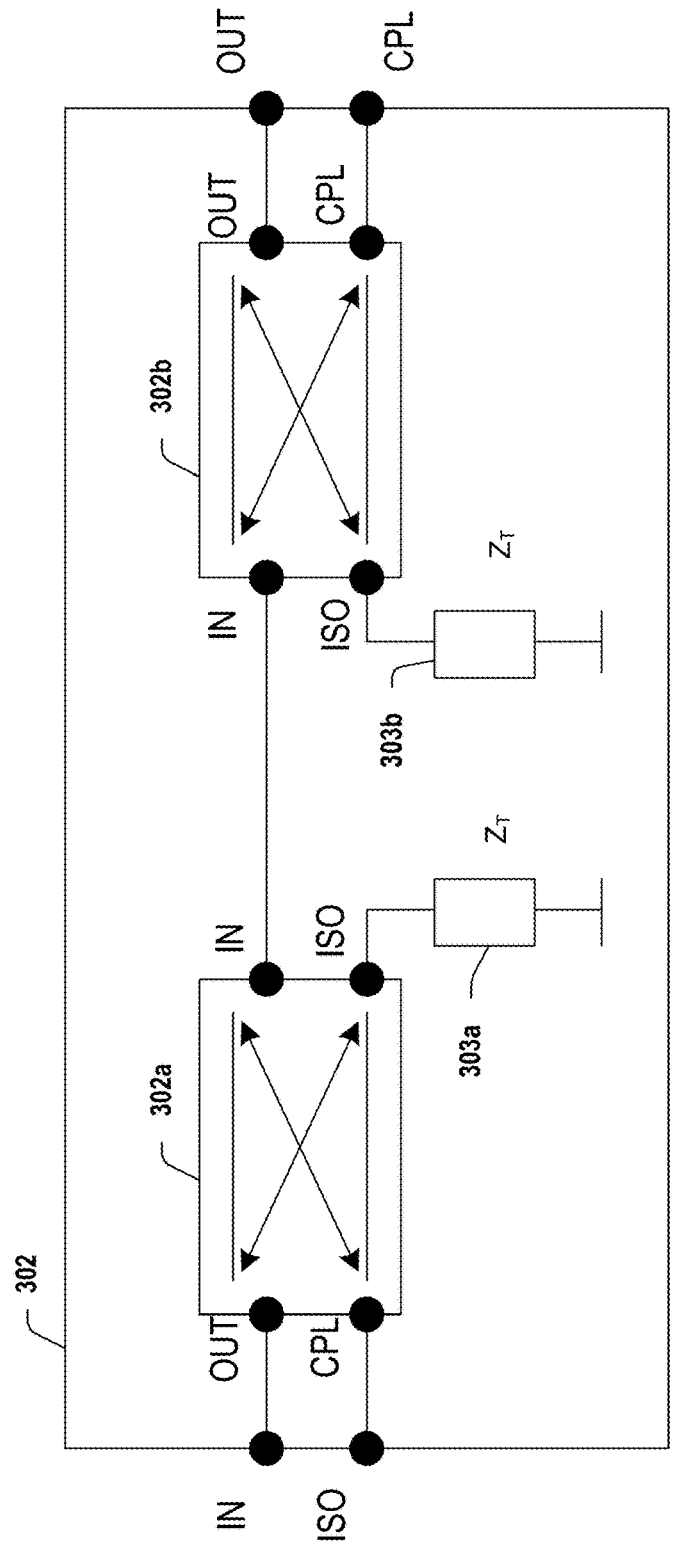
FIG. 3 illustrates a directional coupler having multiple cells and a termination impedance. This arrangement can for example be used as the directional coupler in the examples above.

The directional coupler 102 may be implemented having multiple cells as it is illustrated in FIG. 3.

FIG. 3 illustrates a directional coupler 300 having multiple cells and a termination impedance. This arrangement can for example be used as the directional coupler 102 in the examples above.

The arrangement includes a first cell 302a and a second cell 302b. The first cell 302a has an OUT and an CPL port connected to the IN and the ISO ports of the arrangement 300, respectively. An IN port of the first cell 302a is connected to an OUT port of the second cell 302b. An ISO port of the first cell 302a is connected to a first termination impedance 303a having a complex value $Z_T$.

The second cell 302b has its ISO port connected to a second termination impedance also having the complex value $Z_T$, its OUT port is connected to an OUT port of the arrangement 300 and its CPL port connected to a CPL port of the arrangement 300.

The first and second cells 302a and 302b can be implemented as magnetically-coupled transformer with inter-winding capacitances.

Figure 4:
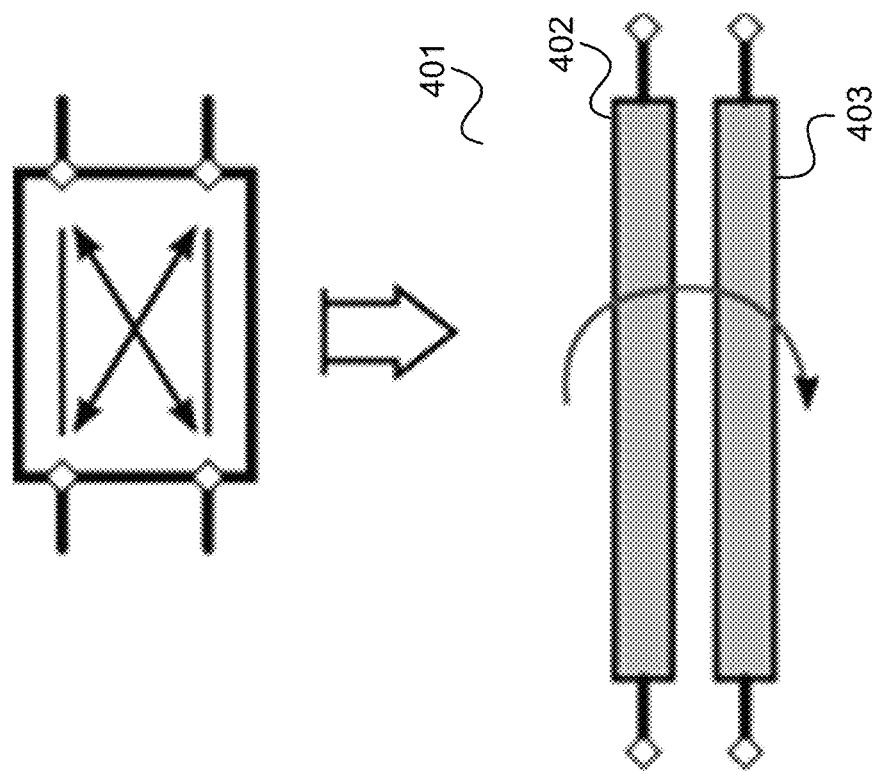
FIG. 4 shows an implementation of a directional coupler.

FIG. 4 shows an implementation of a directional coupler 401, e.g. corresponding to one or both of the first and the second cells 302a and 302b, using a first conductive path 402 coupled between the input port and the output port of the coupler 401 and a second conductive path 403 coupled between the coupled port and the isolated port of the coupler 401, wherein the first and the second conductive paths 402 and 403 are electrostatically and electromagnetically coupled with each other.

Figure 5:
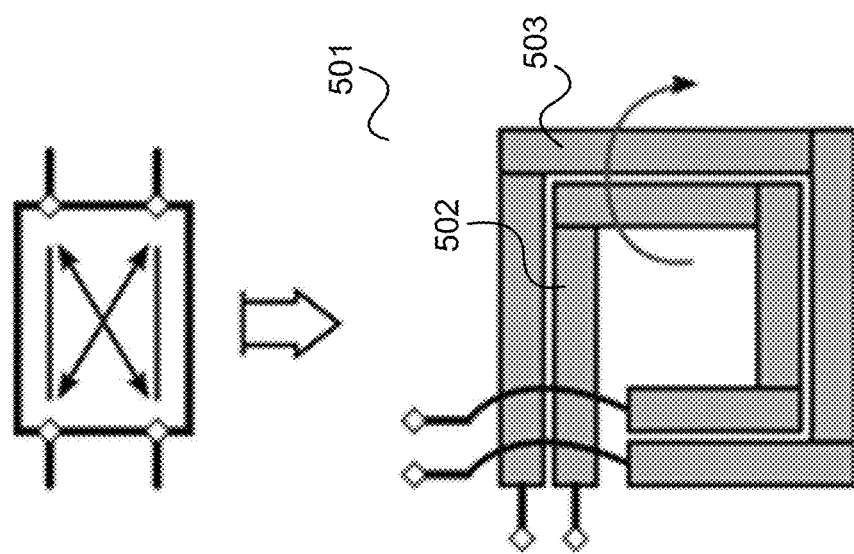
FIG. 5 shows another implementation of a directional coupler.

FIG. 5 shows another implementation of a directional coupler 501, e.g. corresponding to one or both of the first and the second cells 302a and 302b, using a first conductive path 502 coupled between the input port and the output port of the coupler 501 and a second conductive path 503 coupled between the coupled port and the isolated port of the coupler 501, wherein the first and the second conductive paths 502 and 503 are electrostatically and electromagnetically coupled with each other.

Figure 6:
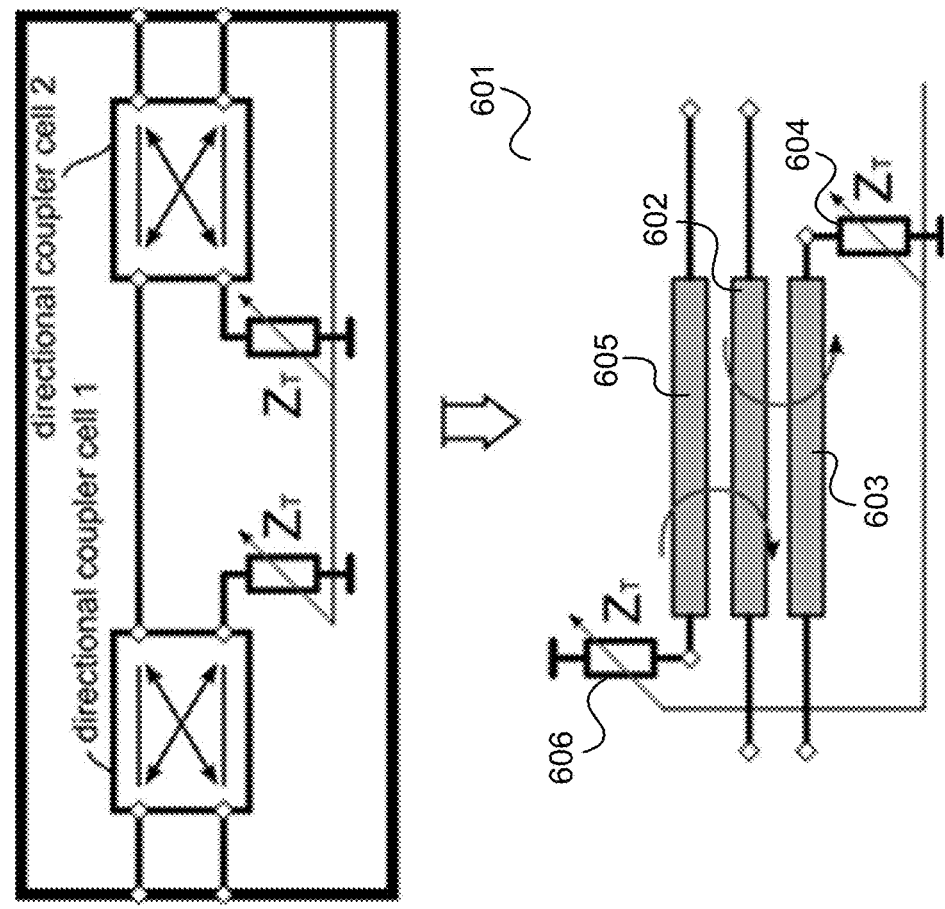
FIG. 6 shows an implementation of a directional coupler comprising two coupler cells.

FIG. 6 shows an implementation of a directional coupler 601, e.g. corresponding to the directional coupler 300.

The directional coupler 601 can be seen to comprise a first directional coupler cell implemented using a first conductive path 602 coupled between the input port and the output port of the coupler 601 and a second conductive path 603 coupled between the isolated port of the directional coupler 601 and a first termination impedance 604, wherein the first and the second conductive paths 602 and 603 are electrostatically and electromagnetically coupled with each other.

The directional coupler 601 can further be seen to comprise a second directional coupler cell implemented using the first conductive path 602 and a third conductive path 605 coupled between the coupled port of the directional coupler 601 and a second termination impedance 606, wherein the first and the third conductive paths 602 and 605 are electrostatically and electromagnetically coupled with each other.

Load impedance (comprising an antenna impedance) may, as explained above, thus be measured by extracting amplitude and phase information for RF signals propagating in the forward and reverse directions in the signal path, e.g. by directional couplers used to couple out the signal in particular direction. The phase of the load impedance may be measured by means of a mixer circuit. A mixer, however, is an active device requiring supply current in the range of several mA to be able to operate at low-GHz frequencies.

In the following, embodiments are described in which a VSWR detecting system is controlled and conversion results from the VSWR detecting system are post-processed such that vector value of the impedance can be calculated. This can for example be implemented with a current consummation current in the range of 300 µA during conversion. In the following embodiments, the phase information is extracted from the set of scalar measurements performed for different settings of the directional coupler.

Figure 7:
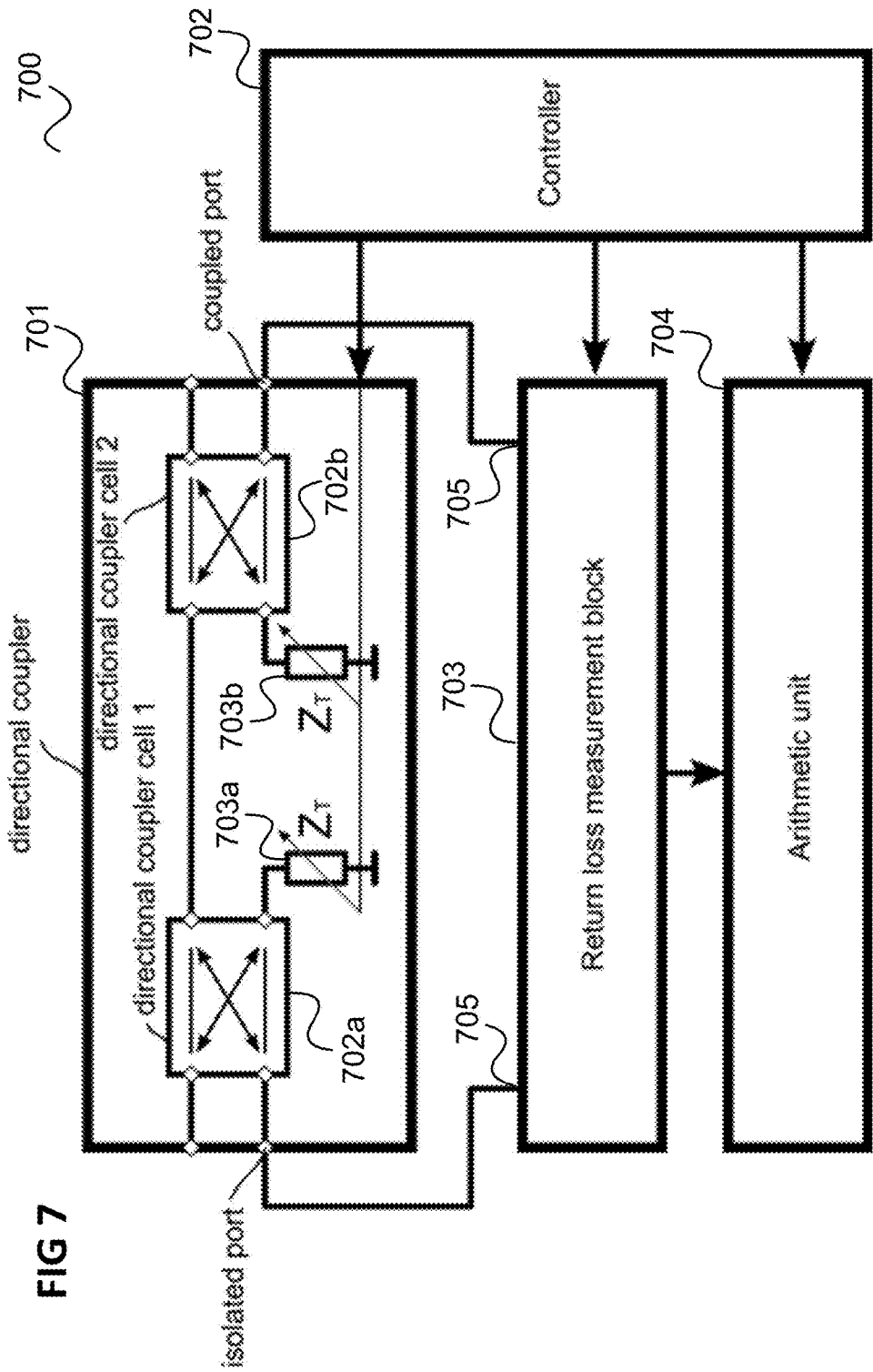
FIG. 7 shows an impedance measurement system according to an embodiment.

FIG. 7 shows an impedance measurement system 700 according to an embodiment.

The impedance measurement system 700 comprises a directional coupler 701 as described with reference to FIG. 3 including a first cell 702a and a second cell 702b. The first cell 702a has an OUT port and a CPL port connected to the IN port and the ISO port of the arrangement, respectively.

An OUT port of the first cell 702a is connected to an OUT port of the second cell 702b. An ISO port of the first cell 702a is connected to a first termination impedance 703a having a complex value $Z_T$.

The second cell 702b has its ISO port connected to a second termination impedance also having the complex value $Z_T$, its IN port is connected to an IN port of the arrangement 701 and its CPL port connected to a CPL port of the arrangement 701.

In contrast to the directional coupler 300 of FIG. 3, the termination impedances 703a, 703b of the directional coupler 701 of FIG. 7 are variable. Specifically, the impedance measurement system 700 comprises a controller 702 that may set the terminal impedances 703a, 703b to different values.

The controller 702 may for example set the terminal impedances 703a, 703b both to the same value at a time wherein it may select the value from a predefined set of values. The controller 702 for example sets the terminal impedances 703a, 703b to each value of the predefined set of values and for each value of the predefined set of values, controls a return loss measurement block 703 of the impedance measurement system 700 to determine the return loss for the value of the terminal impedances 703a, 703b. The return loss measurement block 703 may for example be implemented and operate like the return loss measurement block 106 described with reference to FIGS. 1 and 2.

The return loss measurement block 703 generates a plurality of return losses (one for each value of the terminal impedances 703a, 703b). The impedance measurement system 700 comprises an arithmetic unit which calculates the complex value of the load impedance (i.e. the load impedance vector) of a load (e.g. an antenna or antenna arrangement (for example including further components like a tuner) connected to the out port of the directional coupler. 701

The return loss measurement block 703 measures, e.g. as explained above with reference to FIG. 2, the scalar power difference between its input terminals 705. For example expressed in dB, this difference indicates the return loss caused by the load. The return loss value expressed in dB is denoted as RL in the following.

By means of the adjustable (programmable) termination impedances 703a, 703b the controller 702 may move the characteristic impedance of the directional coupler 701 to a value different from the characteristic system impedance $Z_0$ (e.g. $Z_0$=50 Ohm).

According to one embodiment, the arithmetic unit 704 calculates the complex load impedance $Z_L$ located on a Smith chart at $$S_{11\_ZL} = \frac{Z_L - Z_0}{Z_L + Z_0}$$

wherein the input data for calculation are:
1) Return loss $RL_1$ measured when the termination impedances 703a, 703b of the coupler 701 are set to $Z_{T1}$,
2) Return loss $RL_2$ measured when the termination impedances 703a, 703b of the coupler 701 are set to $Z_{T2}$.

Figure 8:
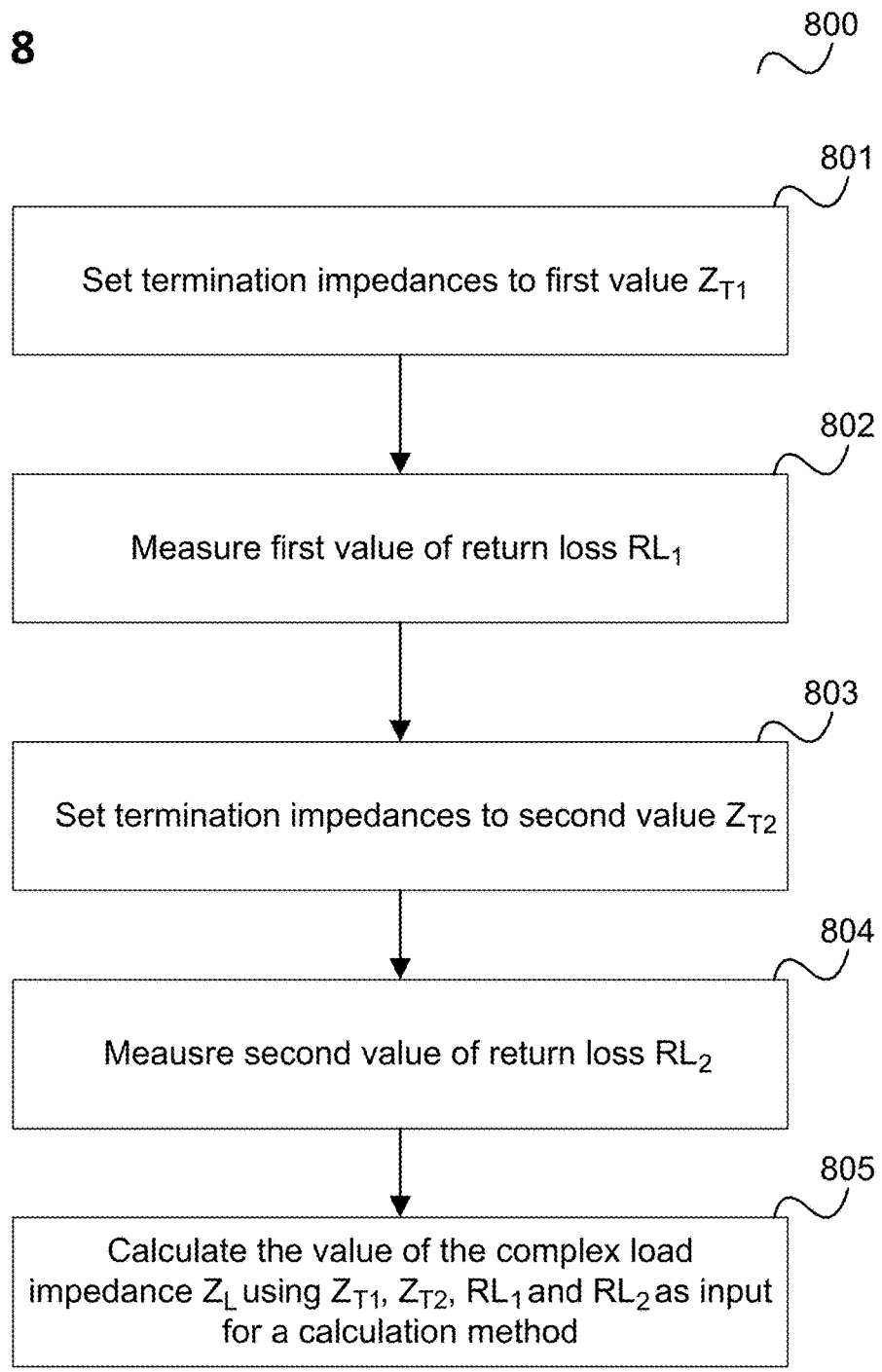
FIG. 8 shows a flow diagram illustrating an operation flow of the impedance measurement system.

FIG. 8 shows a flow diagram 800 illustrating an operation flow of the impedance measurement system 700.

In 801, the controller 702 sets the termination impedances 703a, 703b to the first value $Z_{T1}$.

In 802, the controller 702 controls the return loss measurement block 703 to measure the first value of return loss $RL_1$.

In 803, the controller 702 sets the termination impedances 703a, 703b to the second value $Z_{T2}$.

In 804, the controller 702 controls the return loss measurement block 703 to measure the second value of return loss $RL_2$.

In 805, the controller controls the arithmetic unit 704 to calculate the value of complex load impedance $Z_L$ using $Z_{T1}$, $Z_{T2}$, $RL_1$, $RL_2$ as input for a calculation method.

In the following, an example for the calculation of a complex load impedance $Z_L$ is given valid for real values of termination impedances $Z_{T1}$, $Z_{T2}$.

Figure 9:
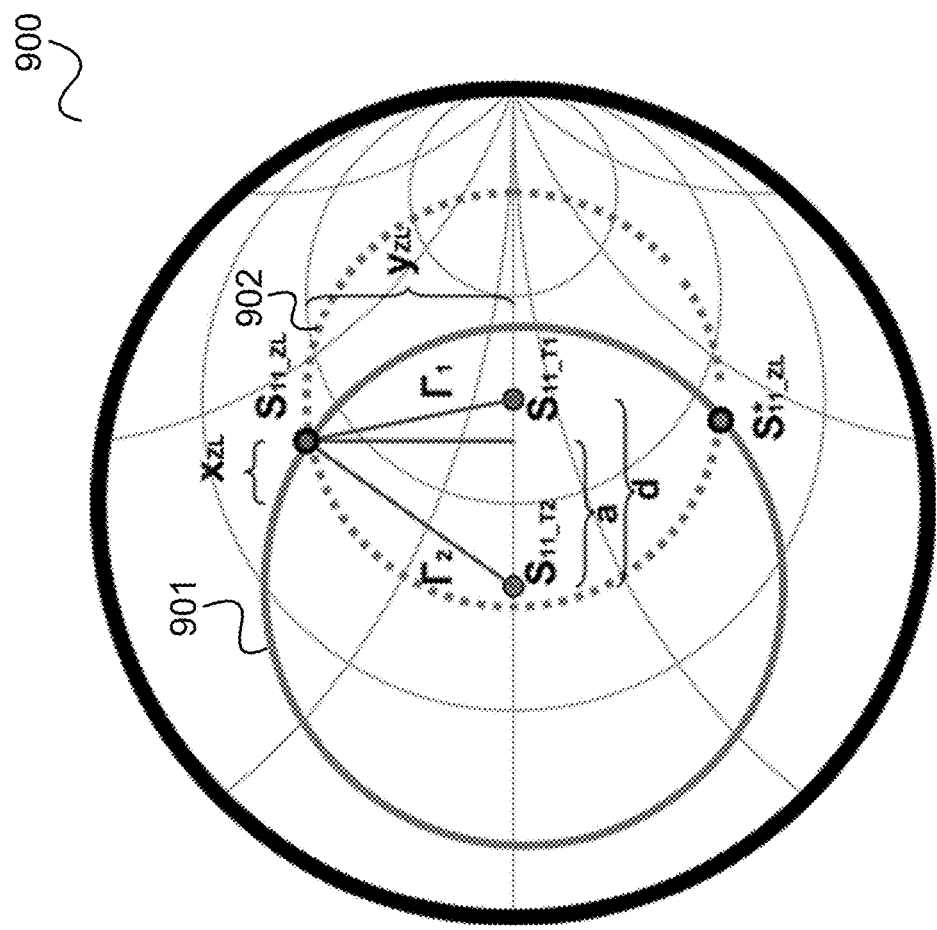
FIG. 9 shows a Smith chart illustrating the calculation of the complex load impedance.

FIG. 9 shows a Smith chart 900 illustrating the calculation of the complex load impedance $Z_L$. The calculation as described below gives two possible complex values for the complex load impedance $Z_L$ given by the intersection of a first circle 901 and a second circle 902 in the smith diagram 900.

The arithmetic unit 704 for example calculates the complex load impedance $Z_L$ according to the following equations.

Calculate the first VSWR value:

$$VSWR_1 = \frac{1 + 10^{-\frac{RL_1}{20}}}{1 - 10^{-\frac{RL_1}{20}}} \quad (1)$$

Calculate the second VSWR value:

$$VSWR_2 = \frac{1 + 10^{-\frac{RL_2}{20}}}{1 - 10^{-\frac{RL_2}{20}}} \quad (2)$$

Calculate the center of the first circle 901:

$$S_{11\_r1} = -\left(\frac{Z_{r1} \cdot VSWR_1 - Z_0}{Z_{r1} \cdot VSWR_1 + Z_0} + \frac{Z_{r1}/VSWR_1 - Z_0}{Z_{r1}/VSWR_1 + Z_0}\right)/2 \quad (3)$$

Calculate the center of the second circle 902:

$$S_{11\_r2} = -\left(\frac{Z_{r2} \cdot VSWR_2 - Z_0}{Z_{r2} \cdot VSWR_2 + Z_0} + \frac{Z_{r2}/VSWR_2 - Z_0}{Z_{r2}/VSWR_2 + Z_0}\right)/2 \quad (4)$$

Calculate the radius of the first circle:

$$r_1 = \left|\left(-\frac{Z_{r1} \cdot VSWR_1 - Z_0}{Z_{r1} \cdot VSWR_1 + Z_0} + \frac{Z_{r1}/VSWR_1 - Z_0}{Z_{r1}/VSWR_1 + Z_0}\right)/2\right| \quad (5)$$

Calculate the radius of the second circle:

$$r_2 = \left|\left(-\frac{Z_{r2} \cdot VSWR_2 - Z_0}{Z_{r2} \cdot VSWR_2 + Z_0} + \frac{Z_{r2}/VSWR_2 - Z_0}{Z_{r2}/VSWR_2 + Z_0}\right)/2\right| \quad (6)$$

With $$d = \text{Re}\{S_{11\_r1}\} - \text{Re}\{S_{11\_r2}\} \quad (7)$$

the following equation holds true:

$$\Gamma_2^2-\alpha^2=\Gamma_1^2-(d-\alpha)^2 \quad (8)$$

$$a = \frac{d^2 - r_1^2 + r_2^2}{2d} \quad (9)$$

Finally, the coordinates of circles crossing point are:

$$x_{ZL}=\alpha+S_{ii\_T2} \quad (10)$$

$$y_{ZL}=\sqrt{\Gamma_2^1-\alpha^2} \quad (11)$$

The detected impedance locations are:

$$S_{ii\_ZL}=x_{ZL}+jy_{ZL} \quad (12)$$

$$S_{ii\_ZL}=x_{ZL}-jy_{ZL} \quad (13)$$

Therefore, the load impedance is either $$Z_L = Z_0 \frac{1+S_{11\_ZL}}{1-S_{11\_ZL}}$$

or $$Z_L^* = Z_0 \frac{1+S_{11\_ZL}^*}{1-S_{11\_ZL}^*}$$

For determining whether $Z_L$ or $Z_L^*$ is the correct load impedance the controller may set the termination impedances to a third value $Z_{T3}$, control the return loss measurement block 703 to determine a corresponding third return loss $RL_3$.

Figure 10:
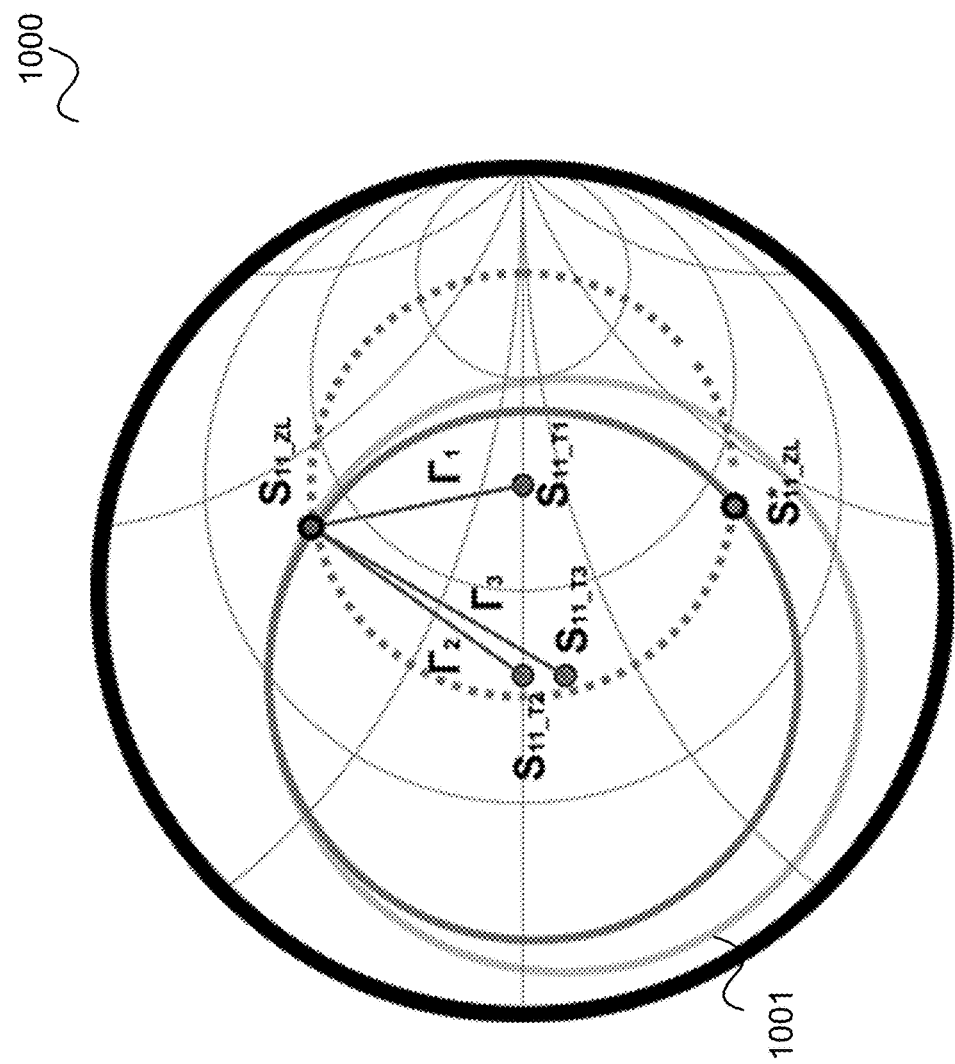
FIG. 10 demonstrates an example of using three step measurements for determining the exact location of impedance point on a Smith Chart.

FIG. 10 demonstrates an example of using three step measurements for determining the exact location of impedance point on a Smith Chart. First, the load impedances $Z_L$ and $Z_L^*$ are determined, e.g. using the approach described above with reference to FIG. 9. After that another iteration of a return loss measurement is performed, in which the characteristic impedance of the coupler is set such that the center of a circle 1001 is shifted (e.g. with respect to the first circle 901 of FIG. 9) along the imaginary plane. The point $S_{11\_T3}$ represents the center of the circle 1001 in the capacitive plane, $\Gamma_3$ is a reflection coefficient corresponding to the measured third return loss RL3. If $\Gamma_3>\Gamma_2$, then the location of load impedance is $Z_L$. Otherwise, the location of load impedance is $Z_L^*$.

Instead of performing a calculation as for example according to equations (1) to (13) the arithmetic unit may perform the determination of the load impedance (i.e. the mapping of measured return losses to load impedance) based on a look-up table stored in a memory, e.g. of a communication such as a mobile phone in which the impedance measurement system 700 is located.

For example, a table like table 1 below may be used which provides an impedance value (corresponding to a use case, e.g. a case where a user covers the antenna with a hand, a use case where the communication device is lying on a table etc.) are provided for all possible combinations of termination impedances and determined return loss ranges.

TABLE 1

| Combination Nr. | $Z_{T1}$ | $Z_{T2}$ | RL₁ min | RL₁ max | RL₂ min | RL₂ max | Impedance (Use Case) |
|---|---|---|---|---|---|---|---|
| 1 | 30Ω | 70Ω | 5 dB | 6 dB | 6 dB | 7 dB | 70 + j70 Ω |
| 2 | 30Ω | 70Ω | 6 dB | 7 dB | 8 dB | 9 dB | 60 + j60 Ω |
| ... | ... | ... | ... | ... | ... | ... | ... |
| 10 | 10Ω | 500Ω | 5 dB | 6 dB | 6 dB | 7 dB | 65 + j65 Ω |
| 11 | 10Ω | 500Ω | 6 dB | 7 dB | 8 dB | 9 dB | 62 + j62 Ω |
| ... | | | | | | | |

As another example, a table like table 2 below may be given for each possible combination of termination impedances which indicates, for each combination of return loss ranges, an impedance value (use cases). In this example, the return loss ranges are labeled from 0 to 7 and the various use cases are referred to by UC1 to UC4. The use cases, for example, could be:

UC1—free space
UC2—beside head left side, i.e. a user is holding a mobile phone beside the head on the left side
UC3—beside head right side, i.e. a user is holding a mobile phone beside the head on the right side
UC4—a user is holding a phone with the left hand, away from the head.

Further, other use cases of user interaction with a mobile handheld device may be defined.

TABLE 2

| $Z_{T1}$, $Z_{T2}$ | | RL₁ | | | | | | |
|---|---|---|---|---|---|---|---|---|
| RL₂ | 0 | 1 | 2 | 3 | 4 | 5 | 6 | 7 |
| 0 | UC1 | UC1 | UC1 | UC1 | UC2 | UC2 | UC2 | UC2 |
| 1 | UC1 | UC1 | UC1 | UC1 | UC2 | UC2 | UC2 | UC2 |
| 2 | UC1 | UC1 | UC1 | UC1 | UC2 | UC2 | UC2 | UC2 |
| 3 | UC1 | UC1 | UC1 | UC1 | UC2 | UC2 | UC2 | UC2 |
| 4 | UC3 | UC3 | UC3 | UC3 | UC4 | UC4 | UC4 | UC4 |
| 5 | UC3 | UC3 | UC3 | UC3 | UC4 | UC4 | UC4 | UC4 |
| 6 | UC3 | UC3 | UC3 | UC3 | UC4 | UC4 | UC4 | UC4 |
| 7 | UC3 | UC3 | UC3 | UC3 | UC4 | UC4 | UC4 | UC4 |

To provide higher flexibility, the directional coupler 300 may be provided with a directional coupler that allows load impedance determination when a signal is supplied from the output side and the load is connected to the input side.

Figure 11:
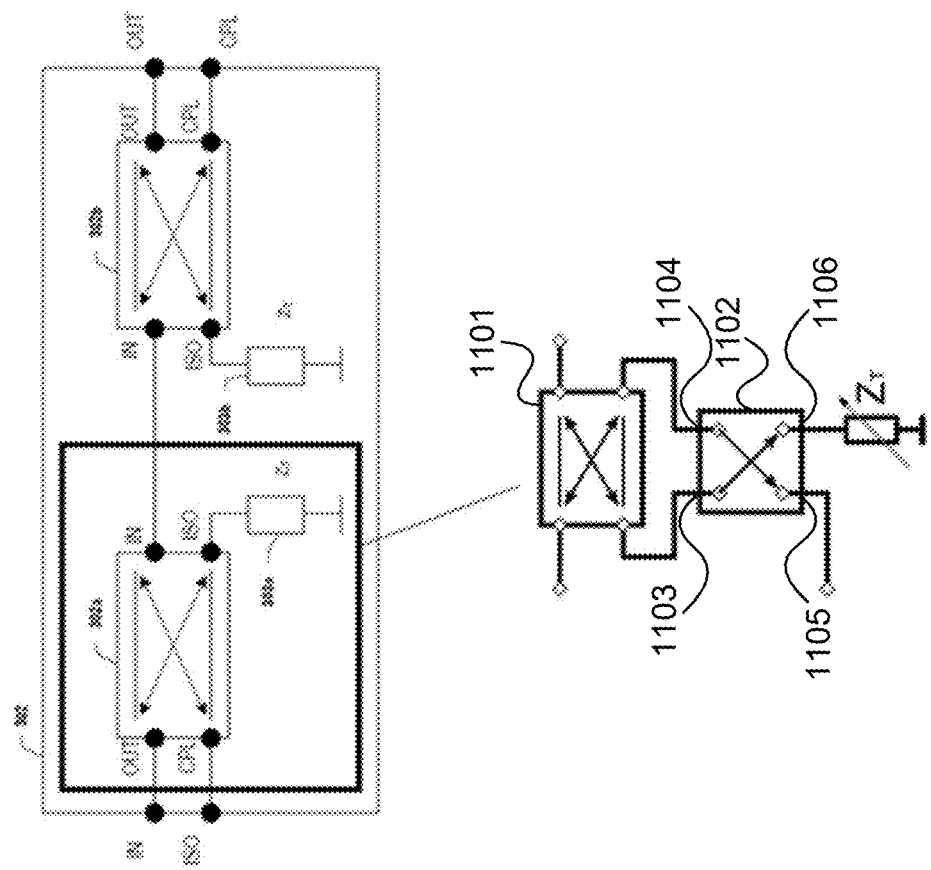
FIG. 11 shows the implementation of a directional coupler including a cross-switch.

FIG. 11 shows the implementation of a directional coupler 1101 including a cross-switch 1102.

The directional coupler 1101 with cross-switch 1102 for example replaces, as illustrated, the first directional coupler cell 302a. It may similarly replace the second directional coupler cell 302b.

The cross-switch 1102 comprises two inputs 1103, wherein the first input 1103 is connected to the CPL port of the directional coupler 1101 and the second input 1104 is connected to the ISO port of the directional coupler 1101.

The cross-switch 1102 comprises two outputs 1105, 1106, wherein the first output 1105 is connected to the second input 1104 and the second output 1106 is connected to the first input 1103, such that the ISO port and the CPL port of the directional coupler 1101 can be seen to be reversed. The first output 1105 may then be connected to the ISO port of the directional coupler 300 and the second output 1106 may be connected to the first termination impedance 303a.

Figure 12:
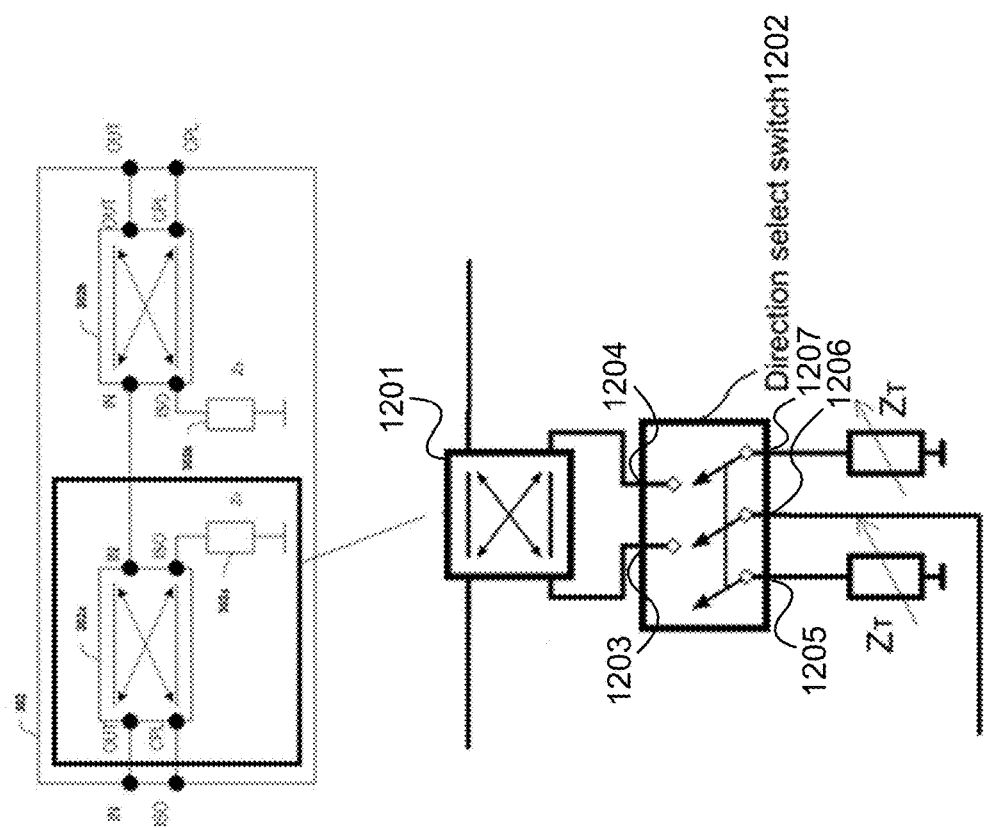
FIG. 12 shows the implementation of a directional coupler including a switchable cross-switch.

FIG. 12 shows the implementation of a directional coupler 1201 including a switchable cross-switch 1202.

The directional coupler 1201 with cross-switch 1202 for example replaces, as illustrated, the first directional coupler cell 302a. It may similarly replace the second directional coupler cell 302b.

The cross-switch 1202 comprises two inputs 1203, wherein the first input 1203 is connected to the CPL port of the directional coupler 1201 and the second input 1204 is connected to the ISO port of the directional coupler 1201.

The cross-switch 1202 comprises three outputs 1205, 1206, 1207 whose connections to the inputs 1203, 1204 can be switched between two configurations.

In a first configuration, the second output 1206 is connected to the first input 1203 and the third output 1207 is connected to the second input 1204. The first output 1205 is not connected in the first configuration.

In a second configuration, the first output 1205 is connected to the first input 1203 and the second output 1206 is connected to the second input 1204. The third output 1207 is not connected in the second configuration.

The first output 1205 and the third output 1207 may be connected to a respective termination impedance 1208 corresponding to the first termination impedance 303a and the second output 1206 may be connected to the ISO port of the directional coupler 300.

Figure 13:
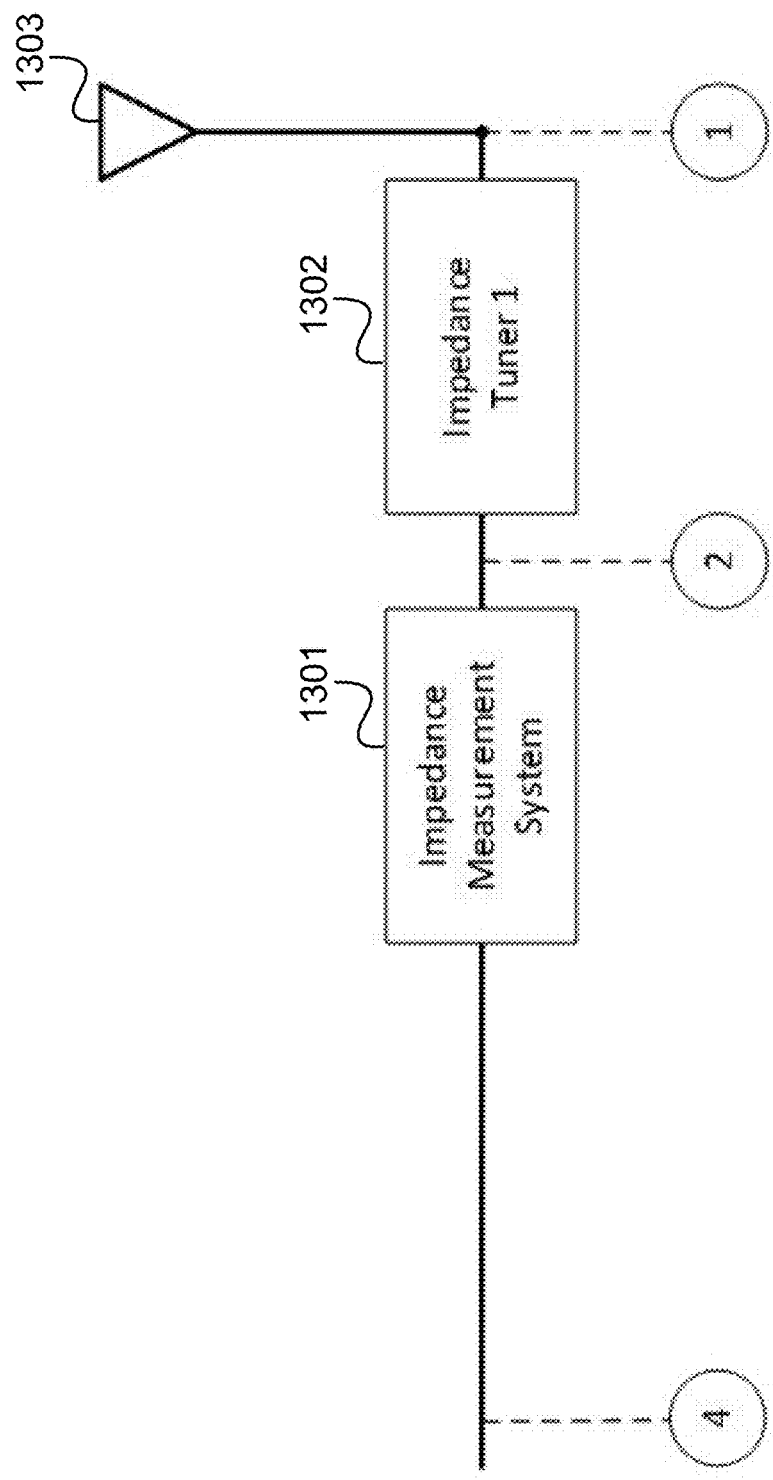
FIG. 13 shows an example of an application of an impedance measurement system

FIG. 13 shows an example of an application of an impedance measurement system 1301, e.g. corresponding to the impedance measurement system 700, in which the impedance measurement system 1301 monitors the impedance in a plane (2) and is configured to tune a first impedance tuner 1302 connected to an antenna 1303 based on a mapping of load impedance at plane (2) to settings of the tuner 1302.

Figure 14:
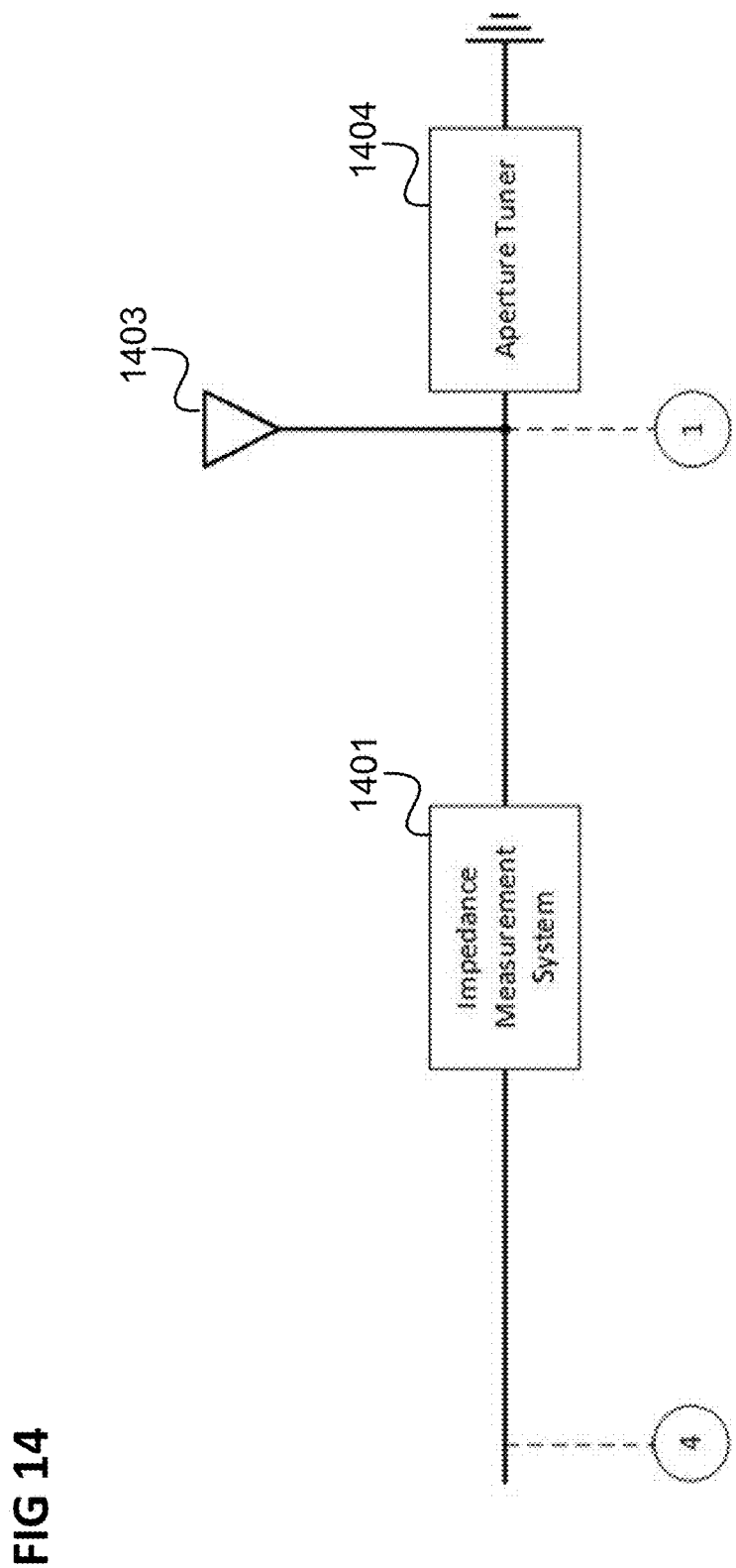
FIG. 14 shows a further example of an application of an impedance measurement system.

FIG. 14 shows an example of an application of an impedance measurement system 1401, e.g. corresponding to the impedance measurement system 700, in which the impedance measurement system 1401 monitors the impedance in a plane (1) and is configured to tune an aperture tuner 1404, connected between an antenna 1403 an ground, based on a mapping of load impedance at plane (1) to settings of the tuner 1404.

Figure 15:
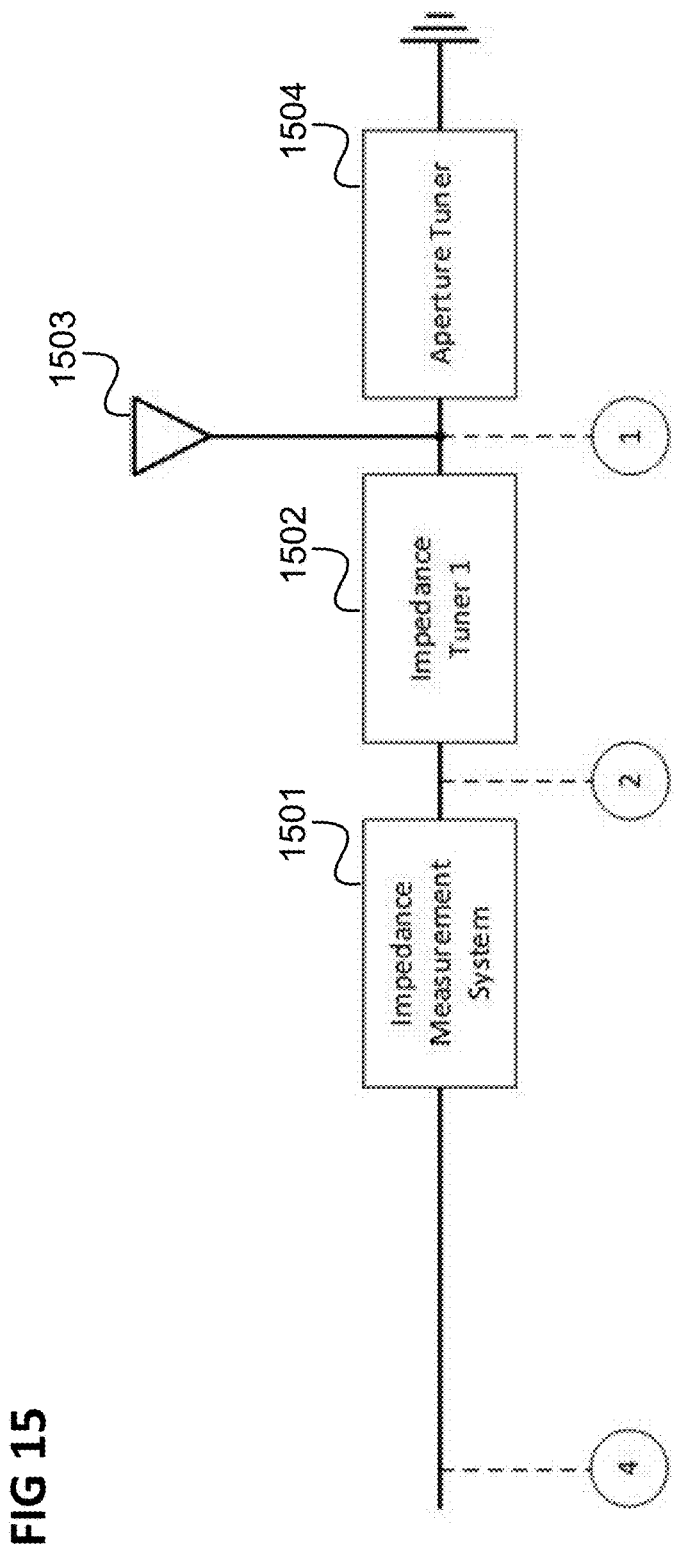
FIG. 15 shows a further example of an application of an impedance measurement system.

FIG. 15 shows an example of an application of an impedance measurement system 1501, e.g. corresponding to the impedance measurement system 700, in which the impedance measurement system 1501 monitors the impedance in a plane (2) and is configured to tune an aperture tuner 1504 connected between an antenna 1503 and ground and a first impedance tuner 1502 connected to the antenna 1503 based on a mapping of load impedance at plane (2) to settings of the tuners 1502, 1504.

Figure 16:
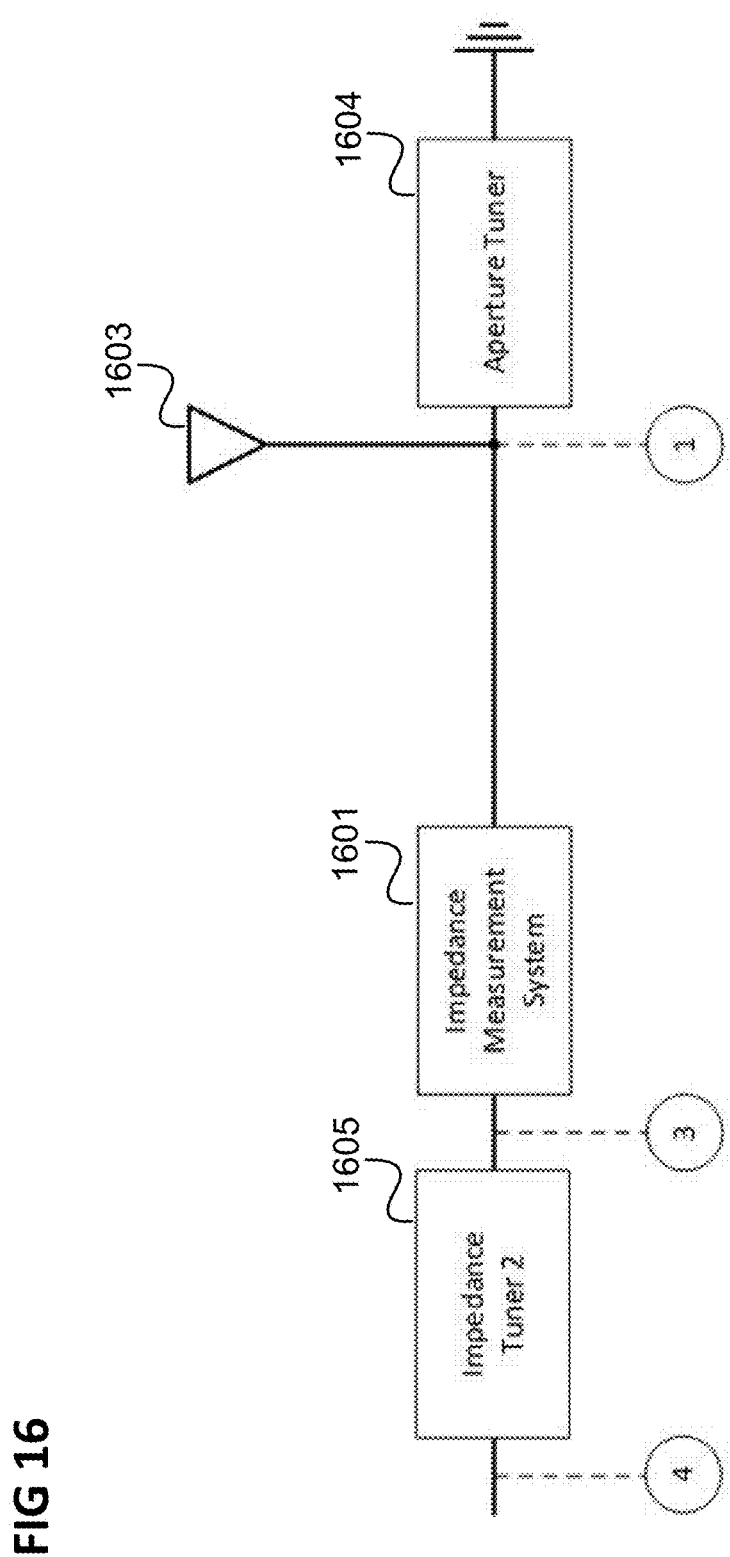
FIG. 16 shows a further example of an application of an impedance measurement system.

FIG. 16 shows an example of an application of an impedance measurement system 1601, e.g. corresponding to the impedance measurement system 700, in which the the impedance measurement system 1601 monitors the impedance in a plane (1) and is configured to tune an aperture tuner 1604 connected between an antenna 1603 and ground and a second impedance tuner 1605 connected in front of the impedance measurement system 1601 based on a mapping of load impedance at plain (1) to settings of the tuners 1604, 1605.

Figure 17:
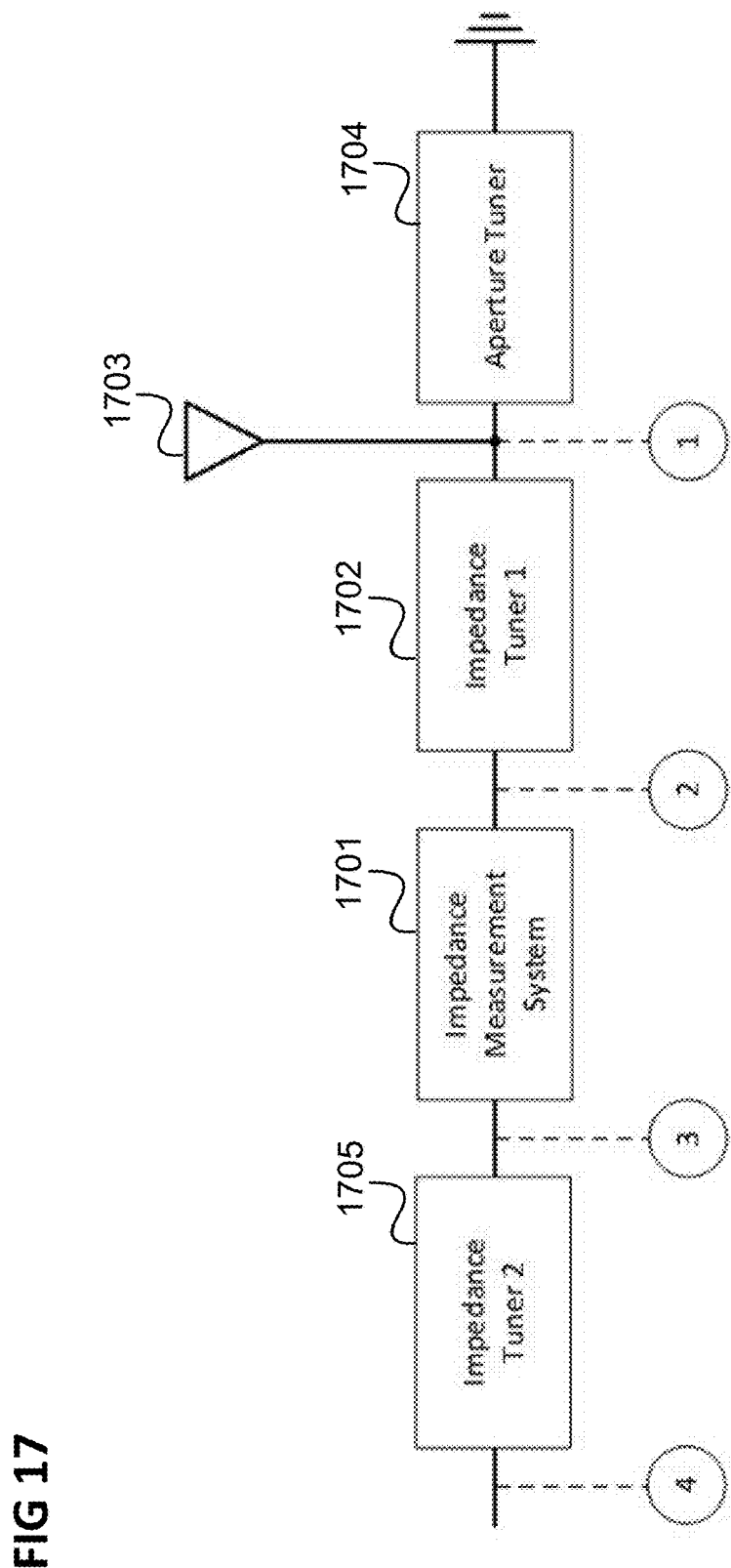
FIG. 17 shows a further example of an application of an impedance measurement system.

FIG. 17 shows an example of an application of an impedance measurement system 1701, e.g. corresponding to the impedance measurement system 700, in which the impedance measurement system 1701 monitors the impedance in a plane (2) and is configured to tune an aperture tuner 1704 connected between an antenna 1703 and ground, and a first impedance tuner 1702 connected to the antenna 1703 and a second impedance tuner 1705 connected in front of the impedance measurement system 1601 based on a mapping of load impedance at plane (2) to settings of the tuners.

Figure 18:
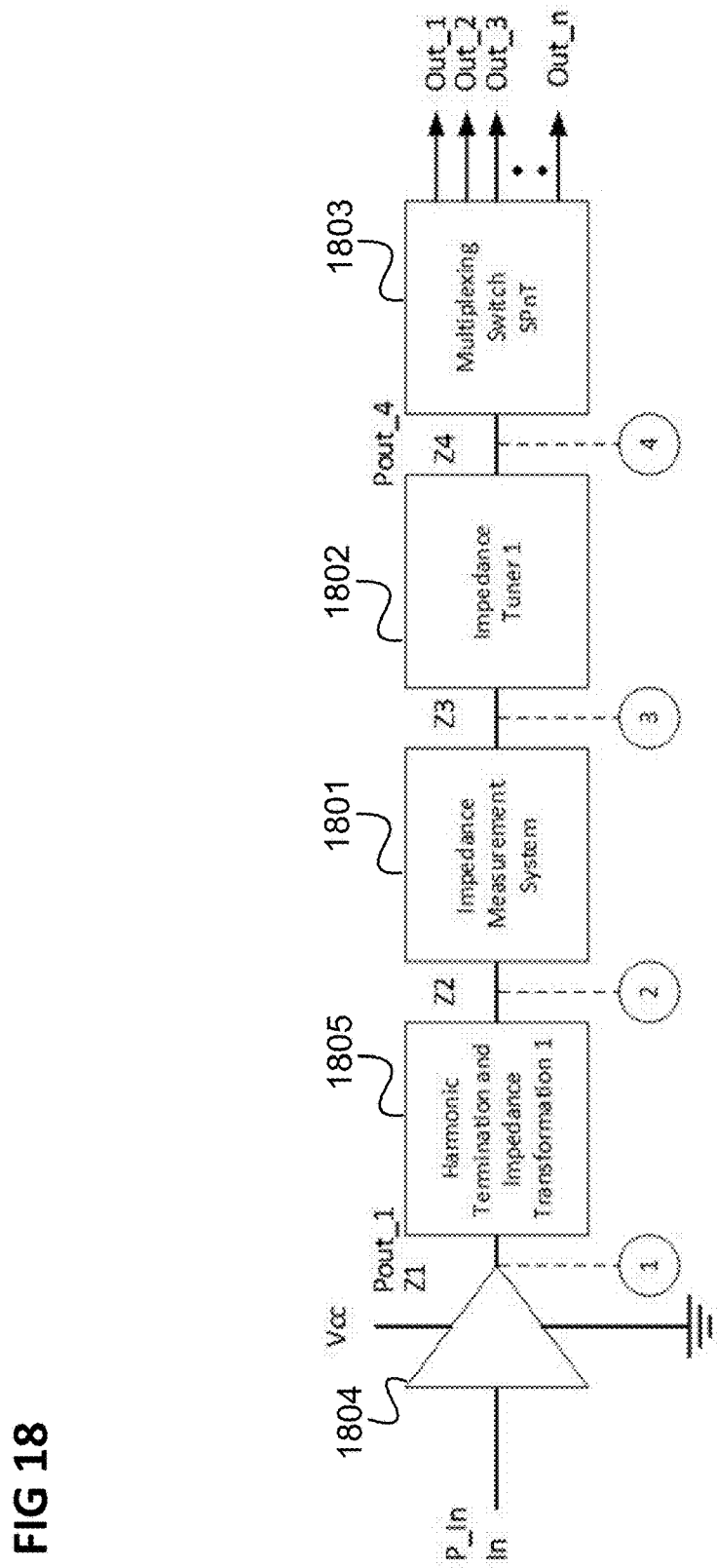
FIG. 18 shows a further example of an application of an impedance measurement system.

FIG. 18 shows an example of an application of an impedance measurement system 1801, e.g. corresponding to the impedance measurement system 700, in which the impedance measurement system 1801 monitors the impedance in a plane (3) and is configured to tune a first impedance tuner 1802 connected between the impedance measurement system 1801 and a multiplexing switch 1803 based on a mapping of the load impedance at the plane (3) versus the output power Pout 1 of a power amplifier 1804 (connected to the impedance measurement system 1801 via a harmonic termination and impedance transformation block 1805) to settings of the tuner 1802 for any of best Power Added Efficiency (PAE) and best Linearity of the Power Amplifier (PA) 1804. The system of FIG. 18 is effectively setting the PA loadline of best PAE and linearity.

Figure 19:
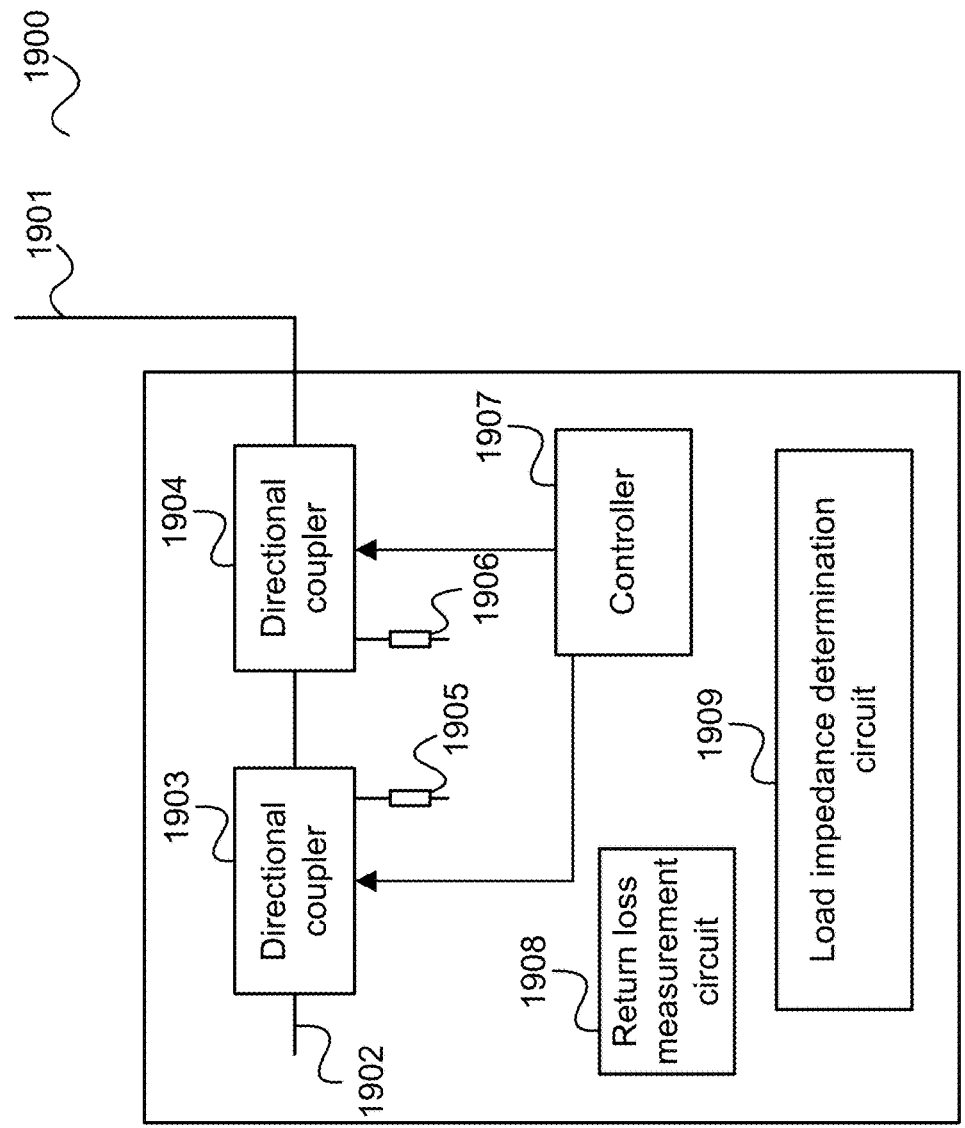
FIG. 19 shows a communication device according to an embodiment.

In summary, according to various embodiments, a communication device as illustrated in FIG. 19 is provided.

FIG. 19 shows a communication device 1900 according to an embodiment.

The communication device 1900 comprises an antenna 1901, a signal path 1902 for supplying a signal to the antenna 1901 and two directional couplers 1903, 1904 arranged within the signal path, wherein each directional coupler 1903, 1904 is coupled to an adjustable impedance 1905, 1906 defining the characteristic impedance of the directional coupler 1903, 1904.

The communication device 1900 further comprises a controller 1907 configured to set, for each of a plurality of impedances, the adjustable impedances 1905, 1906 of the directional couplers 1903, 1904 to the impedance.

Further, the communication device 1900 comprises a return loss measurement circuit 1908 configured to determine, for each of the plurality of impedances, a return loss of the signal path 1902 when the adjustable impedances 1905, 1906 of the directional couplers are set to the impedance and a load impedance determination circuit 1909 configured to determine a load impedance of the signal path 1902 based on the determined return losses.

According to one embodiment, in other words the return loss of a path to an antenna is measured for multiple characteristic impedances of directional couplers arranged in the path and the impedance of a load of the path is determined based on the multiple return loss measurements that are thus obtained.

For example, the communication device comprises a dual-branch directional coupler (or a directional coupler constructed of two back-to-back coupler cells), two adjustable termination impedances at the isolated ports of each branch (or each coupler cell), a return loss measurement block attached to the directional coupler and measuring the power difference between the forward and reverse coupled powers and a controller for two adjustable termination impedances and the return loss measurement block. The return loss measurement circuit may for example measure the VSWR two or more times at different values of adjustable termination impedances and post-process the results to obtain the complex value of load (antenna) impedance.

According to definition used herein, the characteristic impedance of a directional coupler may be understood as an impedance of the signal path for which the maximum difference between the power at the coupled port and the power at the isolated port is achieved.

In one example, if the directional coupler is configured to have a characteristic impedance of 50 Ohm, then the power difference measured at coupled and isolated ports of the coupler has the highest value if the input or output ports or both of the coupler are terminated with 50 Ohm. For any other termination impedance at input and/or output ports of the coupler the power difference between the isolated and coupled ports will be less than for the case of 50 Ohm termination.

In another example, if the directional coupler is configured to have characteristic impedance of 90 Ohm, then the power difference measured at coupled and isolated ports of the coupler has the highest value if the input and/or output ports of the coupler is terminated with 90 Ohm. For any other termination impedance at input and/or output ports of the coupler the power difference between the isolated and coupled ports will be less than for the case of 90 Ohm termination.

Figure 20:
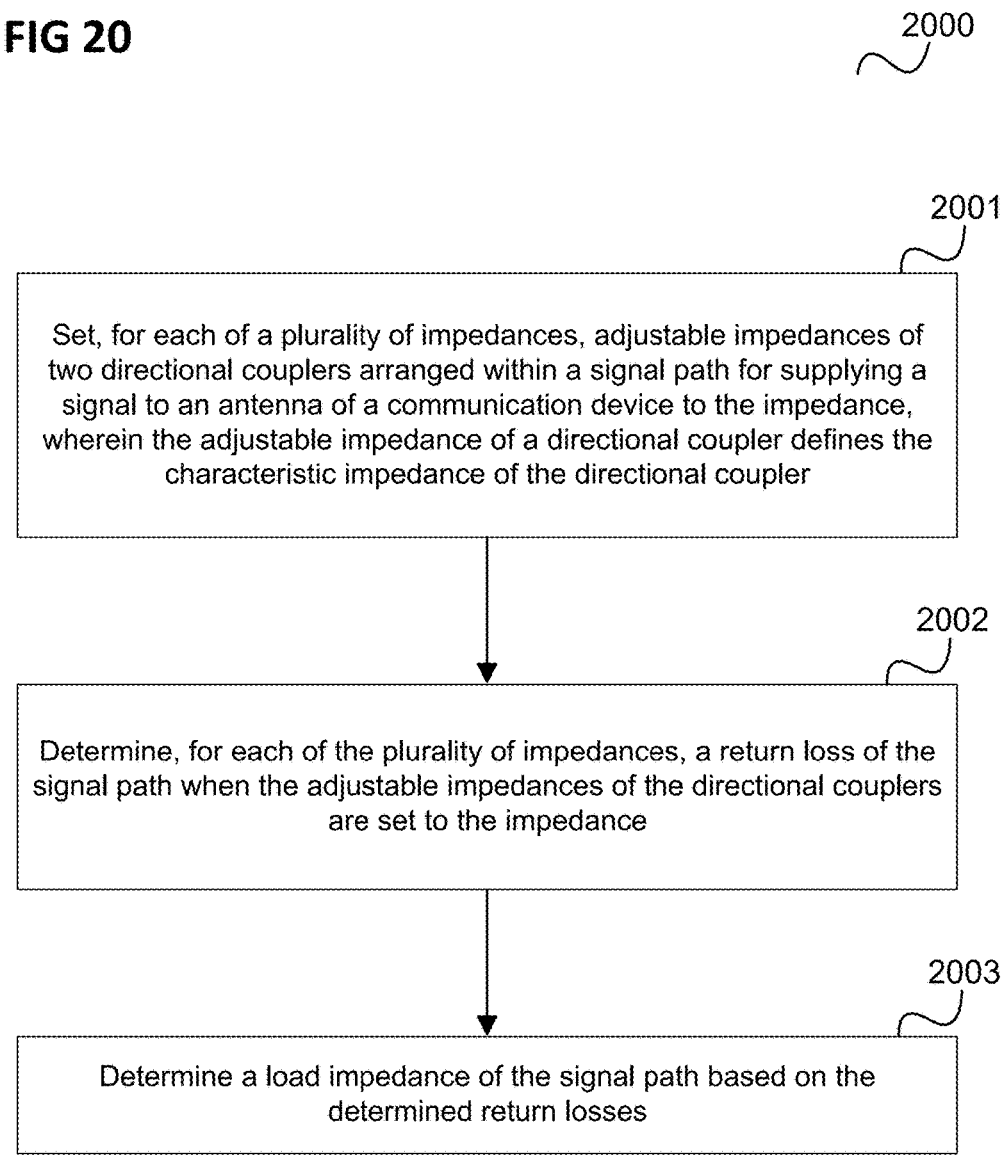
FIG. 20 shows a flow diagram illustrating a method for determining a load impedance.

The communication device for example carries out a method for determining a load impedance as illustrated in FIG. 20.

FIG. 20 shows a flow diagram 2000.

In 2001, for each of a plurality of impedances, adjustable impedances of two directional couplers arranged within a signal path for supplying a signal to an antenna of a communication device are set to the impedance, wherein the adjustable impedance of a directional coupler defines the characteristic impedance of the directional coupler.

In 2002, for each of the plurality of impedances, a return loss of the signal path is determined when the adjustable impedances of the directional couplers are set to the impedance.

In 2003 a load impedance of the signal path is determined based on the determined return losses.

In the following, various embodiments are given.

Embodiment 1 is a communication device as illustrated in FIG. 19.

Embodiment 2 is the communication device of embodiment 1, wherein each directional coupler comprises an input port, an output port, a coupled port and an isolated port, and wherein for each directional coupler the adjustable impedance is coupled to the isolated port of the directional coupler.

Embodiment 3 is the communication device of embodiment 2, further comprising a cross-switching element for at least one of the directional couplers, wherein the cross-switching element is configured to exchange the coupled port and the isolated port of the directional coupler, and the adjustable impedance is coupled to the directional coupler via the cross-switch.

Embodiment 4 is the communication device of embodiment 2 or 3, wherein each directional coupler comprises a first conductive path coupled between the input port and the output port of said directional coupler, and a second conductive path coupled between the coupled port and the isolated port of said directional coupler, wherein the first conductive path and the second conductive path are electrostatically and electromagnetically coupled with each other.

Embodiment 5 is the communication device of any one of embodiments 1 to 4, wherein the adjustable impedance is coupled between the isolated port and ground.

Embodiment 6 is the communication device of any one of embodiments 1 to 5, wherein the directional couplers are serially connected in the signal path.

Embodiment 7 is the communication device of any one of embodiments 1 to 6, wherein the directional couplers are arranged back-to-back.

Embodiment 8 is the communication device of any one of embodiments 1 to 7, wherein each directional coupler comprises an input port, wherein the input ports of the directional couplers are connected together.

Embodiment 9 is the communication device of any one of embodiments 1 to 8, comprising a load connected to the signal path at the antenna side, wherein the load impedance of the signal path is an impedance of the load.

Embodiment 10 is the communication device of embodiment 9, wherein the load comprises the antenna.

Embodiment 11 is the communication device of any one of embodiments 1 to 10, wherein the signal is a radio frequency signal.

Embodiment 12 is the communication device of any one of embodiments 1 to 11, comprising a signal source configured to supply the signal to the signal path.

Embodiment 13 is the communication device of any one of embodiments 1 to 12, wherein the two directional couplers form two directional coupler cells or two coupled branches of a directional coupler arranged in the signal path.

Embodiment 14 is the communication device of embodiment 13, wherein the directional coupler comprises an input port and an output port and the signal path leads through the directional coupler from the input port to the output port.

Embodiment 15 is the communication device of embodiment 13 or 14, wherein the directional coupler comprises an isolated port and a coupled port connected to the return loss measurement circuit.

Embodiment 16 is the communication device of any one of embodiments 1 to 15, wherein the signal path comprises a main line and each directional coupler comprises a coupled line coupled to the main line.

Embodiment 17 is the communication device of embodiment 16, wherein the coupled lines of both directional couplers are at least partially arranged next to the same section of the main line.

Embodiment 18 is the communication device of any one of embodiments 1 to 17, wherein the load impedance determination circuit is configured to determine the load impedance of the signal path based on a mapping of return losses measured for directional coupler characteristic impedances to load impedances.

Embodiment 19 is the communication device of embodiment 18, comprising a memory storing a representation of the mapping.

Embodiment 20 is the communication device of embodiment 19, wherein the representation is a look-up table indicating the mapping.

Embodiment 21 is the communication device of any one of embodiments 1 to 20, wherein the load impedance determination circuit is configured to determine the load impedance based on an intersection of a first circle in a smith diagram representing a first return loss of the determined return losses with a second circle in the smith diagram representing a second return loss of the determined return losses.

Embodiment 22 is the communication device of any one of embodiments 1 to 21, wherein the load impedance determination circuit is configured to determine the load impedance based on a decision between two intersection points of the first circle and the second circle based on a third return loss of the determined return losses.

Embodiment 23 is the communication device of any one of embodiments 1 to 22, further comprising an antenna tuner configured to tune the antenna based on the determined load impedance.

Embodiment 24 is the communication device of any one of embodiments 1 to 23, further comprising an antenna comprising a feed connection plane and an aperture connection plane, the communication device further comprising any of a first impedance tuner, and a second impedance tuner, and an aperture tuner, wherein the first impedance tuner, the second impedance tuner are coupled to the signal path, and the antenna is coupled to the signal path via the feed connection plane, and the aperture tuner is coupled to the antenna aperture connection plane.

Embodiment 25 is the communication device 24, wherein the controller is configured to tune any of the first impedance tuner, the second impedance tuner and the aperture tuner based on the determined load impedance to minimize the reflection in the signal path.

Embodiment 26 is the communication device of embodiment 25, wherein controller is configured to tune any of the first impedance tuner, the second impedance tuner and the aperture tuner based on a mapping of load impedance to settings of the tuners.

Embodiment 27 is the communication device of embodiment 24, wherein the controller is configured to tune iteratively any of the first impedance tuner, the second impedance tuner and the aperture tuner until the target load impedance in the signal path reaches a predefined threshold value.

Embodiment 28 is the communication device of any one of embodiments 1 to 27 further comprising a power amplifier, a harmonic termination and impedance transformation, an impedance measurements system and a first impedance tuner coupled to the signal path, and a multiplexing switch which couples the signal path to any of n output paths.

Embodiment 29 is the communication device of embodiment 28, wherein the controller is configured to tune the first impedance tuner based on the determined load impedance to increase the power added efficiency of the power amplifier in the signal path by setting a best loadline for a defined supply voltage at a given target output power.

Embodiment 30 is the communication device of embodiment 29, wherein the controller is configured to tune the first impedance tuner based on the determined load impedance to increase the linearity of the power amplifier in the signal path by setting a best loadline for a defined supply voltage at a given target output power.

Embodiment 31 is a method for determining a load impedance as illustrated in FIG. 20.

According to a further embodiment, an RF impedance measurement system (e.g. in a communication device) is provided comprising a dual-branch directional coupler comprising a main RF path and two coupled RF branches, two programmable termination impedances at isolated ports of each branch of the dual-directional coupler, a return loss measurement block attached to the coupled ports of each branch of the dual-directional coupler, a controller programming said termination impedances and starting a return loss measurement procedure, an arithmetic unit performing the calculation of impedance based on the output of return loss measurement block and values of said termination impedances.

According to one embodiment, the dual-branch directional coupler is constructed of three RF lines (main RF path and two coupled RF branches) disposed on a substrate.

According to one embodiment, the dual-branch directional coupler comprises two directional coupler cells coupled back-to-back with each other.

According to one embodiment, the directional coupler cells comprise magnetically-coupled transformer and capacitors coupled between the primary and secondary windings of the magnetically-coupled transformer.

While specific aspects have been described, it should be understood by those skilled in the art that various changes in form and detail may be made therein without departing from the spirit and scope of the aspects of this disclosure as defined by the appended claims. The scope is thus indicated by the appended claims and all changes which come within the meaning and range of equivalency of the claims are therefore intended to be embraced.

What is claimed is:

1. A communication device comprising:
   a signal path for supplying a signal;
   two directional couplers arranged within the signal path, wherein each directional coupler is coupled to an adjustable impedance defining a characteristic impedance of each directional coupler;
   a controller configured to set, for each of a plurality of impedances, the adjustable impedances of the directional couplers to an impedance;
   a return loss measurement circuit configured to determine, for each of the plurality of impedances, a return loss of the signal path when the adjustable impedances of the directional couplers are set to the impedance;
   a load impedance determination circuit configured to determine a load impedance of the signal path based on the determined return losses.

2. The communication device of claim 1, wherein each directional coupler comprises an input port, an output port, a coupled port and an isolated port,
   and wherein for each directional coupler the adjustable impedance is coupled to the isolated port of each directional coupler.

3. The communication device of claim 2, further comprising a cross-switching element for at least one of the directional couplers,
   wherein the cross-switching element is configured to exchange the coupled port and the isolated port of the directional coupler, and
   the adjustable impedance is coupled to the directional coupler via the cross-switch.

4. The communication device of claim 2, wherein each directional coupler comprises
   a first conductive path coupled between the input port and the output port of said directional coupler,
   and a second conductive path coupled between the coupled port and the isolated port of said directional coupler, wherein
   the first conductive path and the second conductive path are electrostatically and electromagnetically coupled with each other.

5. The communication device of claim 2, wherein the adjustable impedance is coupled between the isolated port and ground.

6. The communication device of claim 1, wherein the directional couplers are serially connected in the signal path.

7. The communication device of claim 1, wherein the directional couplers are arranged back-to-back.

8. The communication device of claim 1, wherein each directional coupler comprises an input port, wherein the input ports of the directional couplers are connected together.

9. The communication device of claim 1, further comprising a load connected to the signal path at an antenna side, wherein the load impedance of the signal path is an impedance of the load.

10. The communication device of claim 9, wherein the load comprises an antenna.

11. The communication device of claim 1, wherein the signal is a radio frequency signal.

12. The communication device of claim 1, further comprising a signal source configured to supply the signal to the signal path.

13. The communication device of claim 1, wherein the two directional couplers form two directional coupler cells or two coupled branches of one of the directional couplers arranged in the signal path.

14. The communication device of claim 13, wherein the directional coupler comprises an input port and an output port and the signal path leads through the directional coupler from the input port to the output port.

15. The communication device of claim 13, wherein the directional coupler comprises an isolated port and a coupled port connected to the return loss measurement circuit.

16. The communication device of claim 1, wherein the signal path comprises a main line and each directional coupler comprises a coupled line coupled to the main line.

17. The communication device of claim 16, wherein the coupled lines of both directional couplers are at least partially arranged next to the same section of the main line.

18. The communication device of claim 1, wherein the load impedance determination circuit is configured to determine the load impedance of the signal path based on a mapping of return losses measured for directional coupler characteristic impedances to load impedances.

19. The communication device of claim 18, further comprising a memory storing a representation of the mapping.

20. The communication device of claim 19, wherein the representation is a look-up table indicating the mapping.

21. The communication device of claim 1, wherein the load impedance determination circuit is configured to determine the load impedance based on an intersection of a first circle in a smith diagram representing a first return loss of the determined return losses with a second circle in the smith diagram representing a second return loss of the determined return losses.

22. The communication device of claim 21, wherein the load impedance determination circuit is configured to determine the load impedance based on a decision between two intersection points of the first circle and the second circle based on a third return loss of the determined return losses.

23. The communication device of claim 1, further comprising an antenna tuner configured to tune the antenna based on the determined load impedance.

24. The communication device of claim 1, further comprising
an antenna comprising a feed connection plane and an aperture connection plane,
the communication device further comprising any of:
a first impedance tuner, and
a second impedance tuner, and
an aperture tuner,
wherein the first impedance tuner is coupled to the signal path and the second impedance tuner is coupled to the signal path,
the antenna is coupled to the signal path via the feed connection plane, and
the aperture tuner is coupled to the antenna aperture connection plane.

25. The communication device of claim 24, wherein the controller is configured to tune any of the first impedance tuner, the second impedance tuner and the aperture tuner based on the determined load impedance to minimize a reflection in the signal path.

26. The communication device of claim 25, wherein controller is configured to tune any of the first impedance tuner, the second impedance tuner and the aperture tuner based on a mapping of load impedance to settings of the tuners.

27. The communication device of claim 24, wherein the controller is configured to tune iteratively any of the first impedance tuner, the second impedance tuner and the aperture tuner until a target load impedance in the signal path reaches a predefined threshold value.

28. The communication device of claim 1 further comprising
a power amplifier, a harmonic termination and impedance transformation, an impedance measurements system and a first impedance tuner coupled to the signal path, and
a multiplexing switch which couples the signal path to any of n output paths.

29. The communication device of claim 28, wherein the controller is configured to tune the first impedance tuner based on the determined load impedance to increase the power added efficiency of the power amplifier in the signal path by setting a best loadline for a defined supply voltage at a given target output power.

30. The communication device of claim 29, wherein the controller is configured to tune the first impedance tuner based on the determined load impedance to increase a linearity of the power amplifier in the signal path by setting a best loadline for a defined supply voltage at a given target output power.

31. A method for determining a load impedance comprising:
setting, for each of a plurality of impedances, adjustable impedances of two directional couplers arranged within a signal path for supplying a signal to an antenna of a communication device to an impedance, wherein the adjustable impedance of a directional coupler defines a characteristic impedance of the directional coupler;
determining, for each of the plurality of impedances, a return loss of the signal path when the adjustable impedances of the directional couplers are set to the impedance; and
determining a load impedance of the signal path based on the determined return losses.

* * * * *